(12) United States Patent
Wu

(10) Patent No.: US 8,003,896 B2
(45) Date of Patent: Aug. 23, 2011

(54) MULTI-LAYER PRINTED WIRING BOARD AND MANUFACTURING METHOD THEREOF

(75) Inventor: Youhong Wu, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 11/832,673

(22) Filed: Aug. 2, 2007

(65) Prior Publication Data

US 2008/0053693 A1 Mar. 6, 2008

Related U.S. Application Data

(63) Continuation of application No. PCT/JP2006/301455, filed on Jan. 30, 2006.

(30) Foreign Application Priority Data

Feb. 2, 2005 (JP) .................................. 2005-026898

(51) Int. Cl.
H05K 1/11 (2006.01)
(52) U.S. Cl. ....................................... 174/262; 174/260
(58) Field of Classification Search ........... 174/262–266
See application file for complete search history.

(56) References Cited

U.S. PATENT DOCUMENTS

| | | | | |
|---|---|---|---|---|
| 5,662,987 A | * | 9/1997 | Mizumoto et al. ............. | 428/209 |
| 6,506,982 B1 | * | 1/2003 | Shigi et al. .................... | 174/264 |
| 7,183,497 B2 | * | 2/2007 | Kojima et al. ................. | 174/262 |
| 7,230,188 B1 | * | 6/2007 | En et al. ......................... | 174/257 |
| 7,420,131 B2 | * | 9/2008 | Saiki et al. ..................... | 174/266 |
| 2002/0145197 A1 | | 10/2002 | Ohta et al. | |

FOREIGN PATENT DOCUMENTS

| | | |
|---|---|---|
| EP | 1 011 139 | 6/2000 |
| EP | 1 117 283 | 7/2001 |
| EP | 1 154 480 | 11/2001 |
| JP | 11-251749 | 9/1999 |
| JP | 2000-165046 | 6/2000 |
| JP | 2001-44640 | 2/2001 |
| JP | 2001-127435 | 5/2001 |
| JP | 2001-168531 | 6/2001 |
| JP | 2002-158441 | 5/2002 |
| JP | 2003-209359 | 7/2003 |
| JP | 2003-218531 | 7/2003 |
| JP | 2004-335506 | 11/2004 |

OTHER PUBLICATIONS

U.S. Appl. No. 11/832,892, filed Aug. 2, 2007, Wu.

* cited by examiner

*Primary Examiner* — Ishwarbhai B Patel
(74) *Attorney, Agent, or Firm* — Oblon, Spivak, McClelland, Maier & Neustadt, L.L.P.

(57) ABSTRACT

A multi-layer printed wiring board has a core substrate, a first interlayer insulation layer formed over the core substrate, a first filled via formed in the first interlayer insulation layer, a second interlayer insulation layer formed over the first interlayer insulation layer, and a second filled via formed in the second interlayer insulation layer. The first filled via has a bottom portion having a first diameter. The second filled via has a bottom portion having a second diameter smaller than the first diameter.

12 Claims, 10 Drawing Sheets

FIG. 6
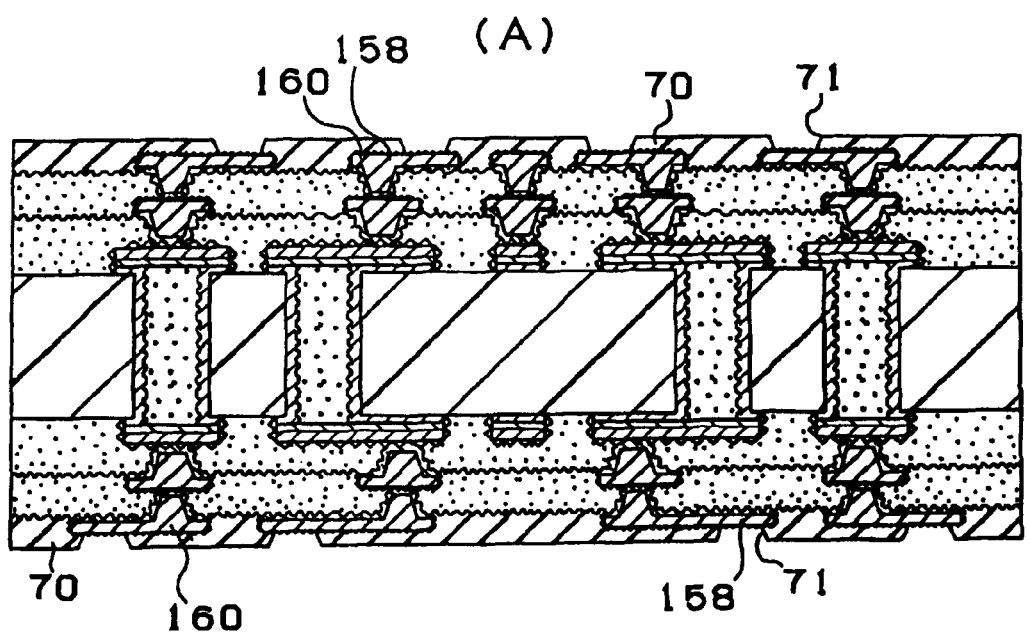
(A)
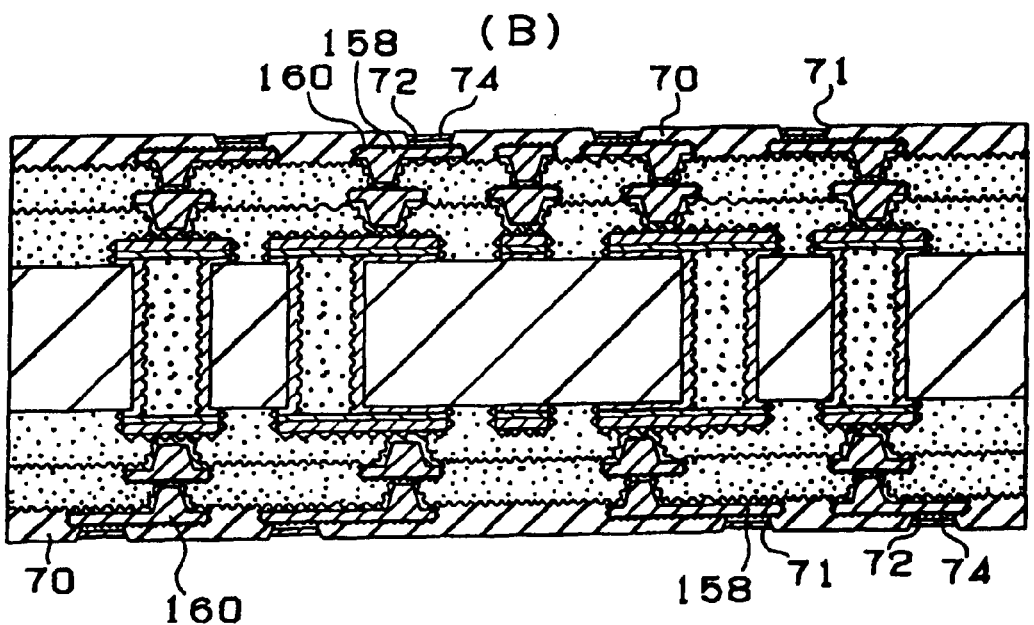
(B)

FIG. 10
(A)
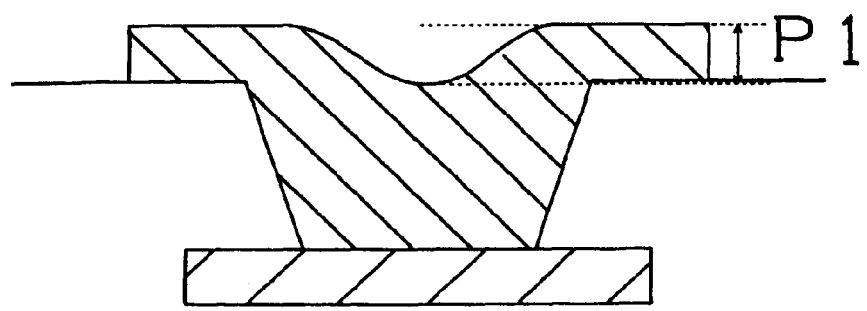
(B)
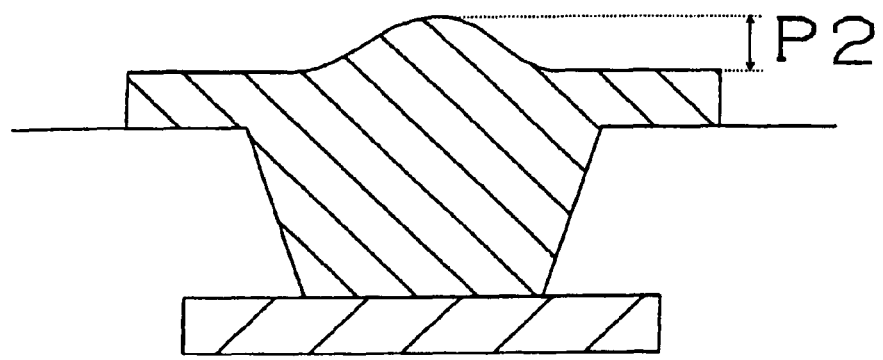

MULTI-LAYER PRINTED WIRING BOARD AND MANUFACTURING METHOD THEREOF

CROSS-REFERENCE TO RELATED APPLICATIONS

The present application is a continuation of a PCT application, PCT/JP2006/301455, filed Jan. 30, 2006, which claims the benefit of priority to Japanese Patent Application No. 2005-026898, filed Feb. 2, 2005. The contents of these applications are incorporated herein by reference in their entirety.

BACKGROUND OF THE INVENTION

1. Field of the Invention

The present invention relates to a multi-layer printed wiring board and a method of manufacturing the multi-layer printed wiring board.

2. Discussion of the Background

Japanese Unexamined Patent Publication No. H11-251749 describes a buildup multi-layer printed wiring board having a core substrate and inter-layer insulation resin layers formed on top and bottom surfaces of the core substrate. This printed wiring board has a stacked via structure in which a via hole formed in a lower insulation resin layer is filled with a filler and has a substantially flat surface, and a via hole formed in an upper insulation resin layer is formed right above the via hole formed in the lower insulation resin layer. The contents of this publication are incorporated herein by reference in their entirety.

SUMMARY OF THE INVENTION

According to one aspect of the present invention, a multi-layer printed wiring board has a core substrate, a first interlayer insulation layer formed over the core substrate, a first filled via formed in the first interlayer insulation layer, a second interlayer insulation layer formed over the first interlayer insulation layer, and a second filled via formed in the second interlayer insulation layer. The first filled via has a bottom portion having a first diameter. The second filled via has a bottom portion having a second diameter smaller than the first diameter.

According to another aspect of the present invention, in a method of manufacturing a multi-layer printed wiring board, a core substrate is formed, a first interlayer insulation layer is formed over the core substrate, a first filled via is formed in the first interlayer insulation layer, a second interlayer insulation layer is formed over the first interlayer insulation layer, and a second filled via is formed in the second interlayer insulation layer. The first filled via has a bottom portion having a first diameter. The second filled via has a bottom portion having a second diameter smaller than the first diameter.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 6(A) and 6(B) are cross-sectional views of the multi-layer printed wiring board during the manufacturing process;

FIGS. 10(A) and 10(B) are schematic illustrations showing filled vias provided in a multi-layer printed wiring board according to one embodiment of the present invention.

DESCRIPTION OF THE EMBODIMENTS

Figure 1:
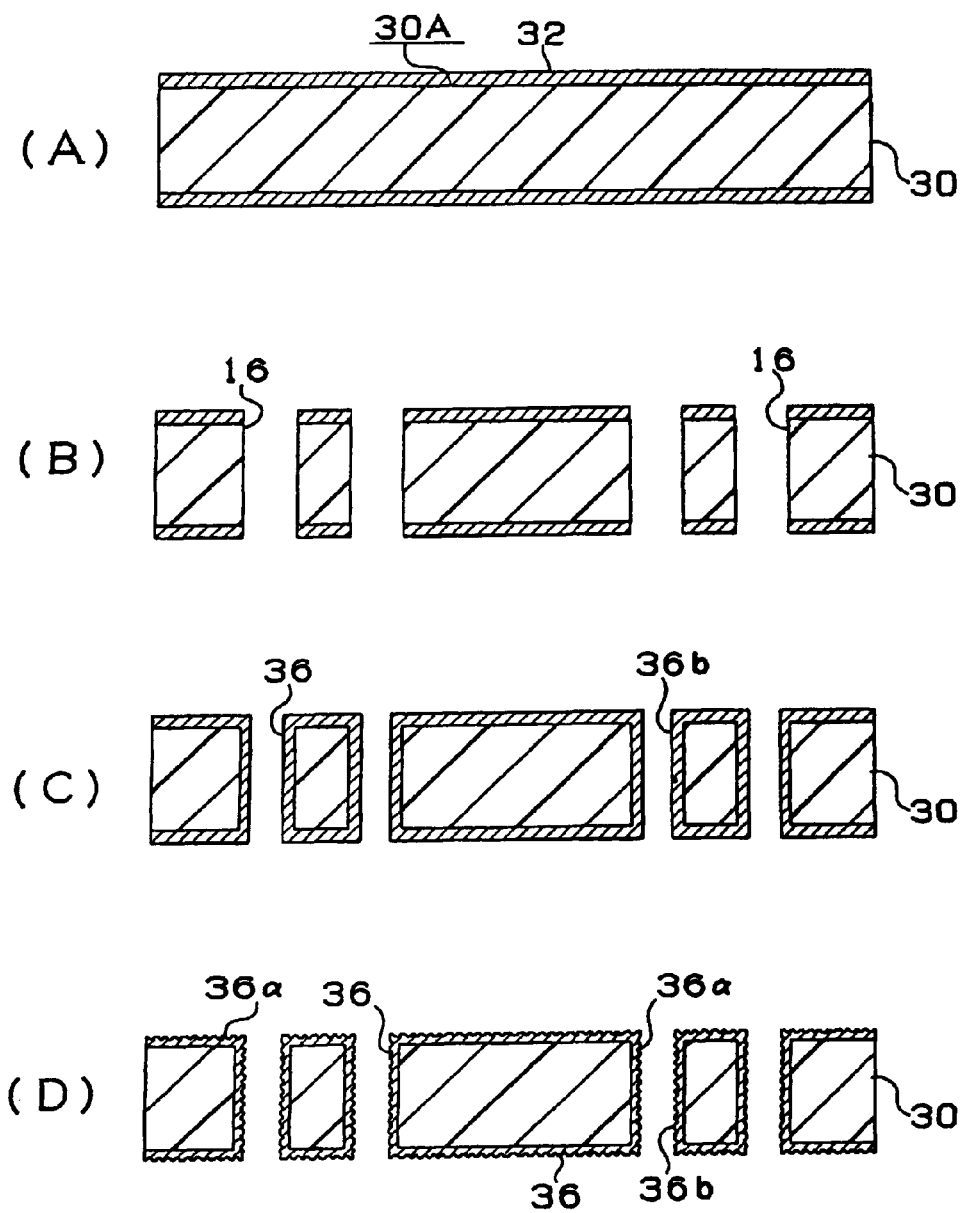
FIGS. 1(A)-1(D) are cross-sectional views of a multi-layer printed wiring board during a manufacturing process according to one embodiment of the present invention.
Figure 2:
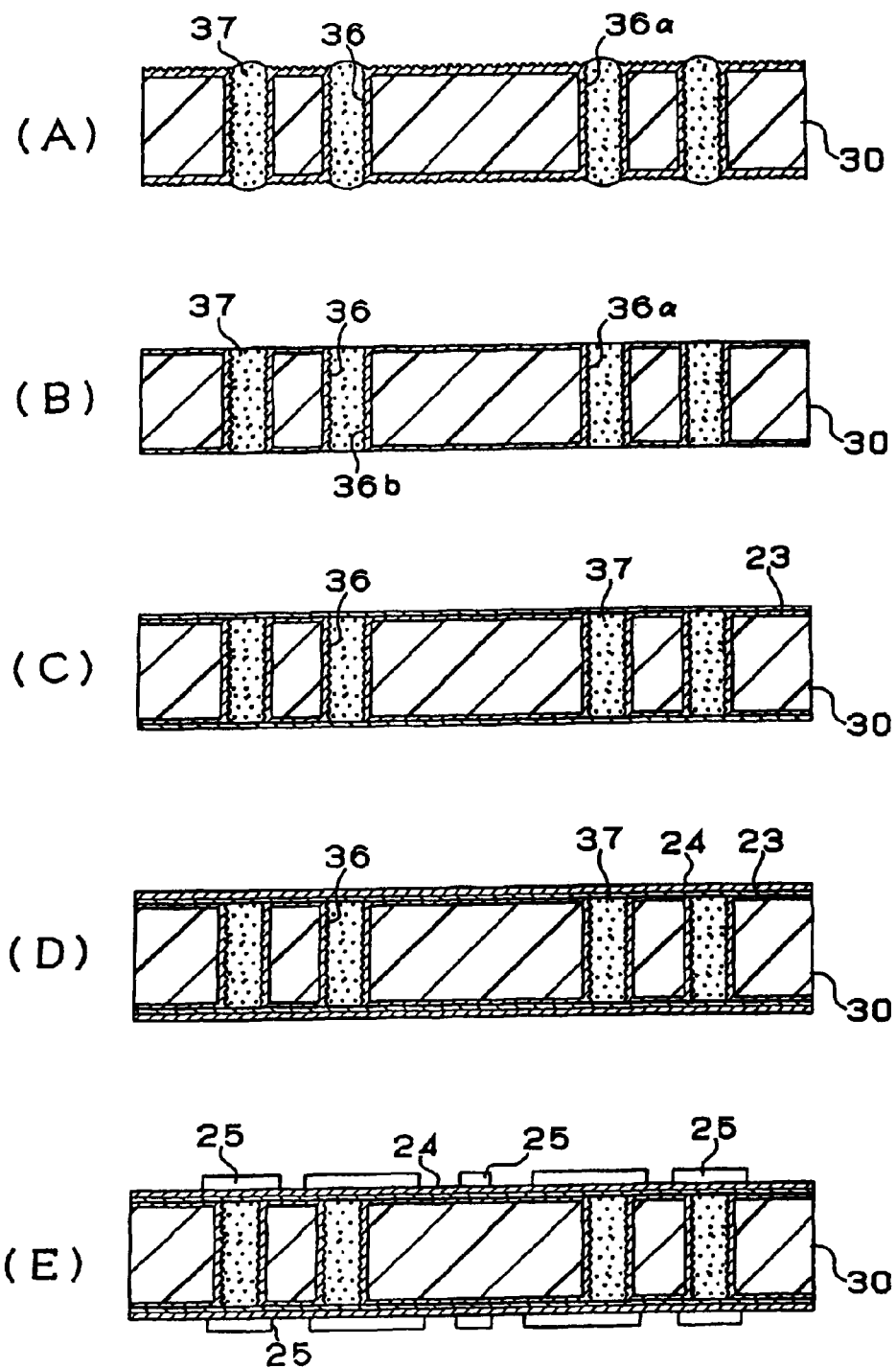
FIGS. 2(A)-2(E) are cross-sectional views of the multi-layer printed wiring board during the manufacturing process.
Figure 3:
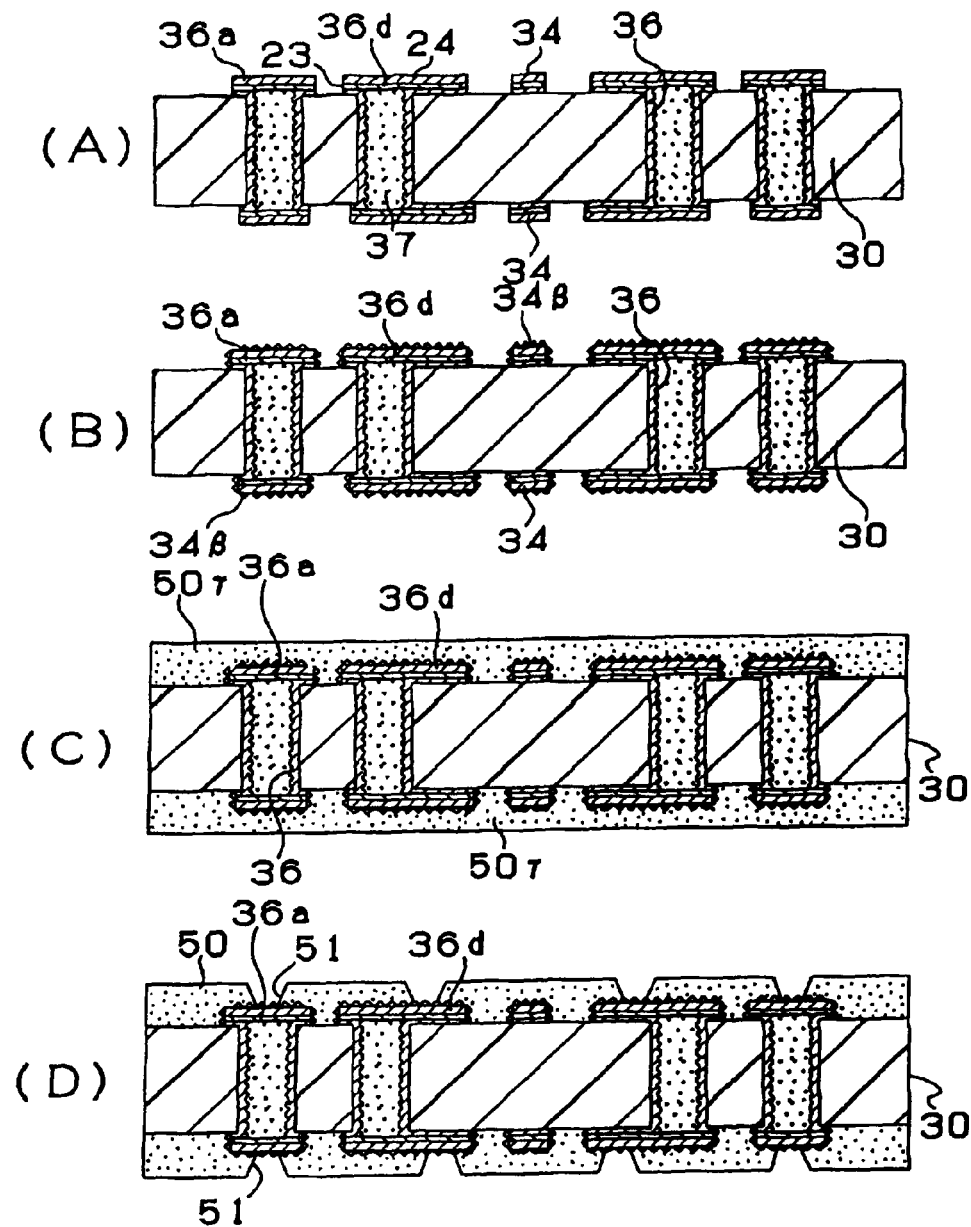
FIGS. 3(A)-3(D) are cross-sectional views of the multi-layer printed wiring board during the manufacturing process.
Figure 4:
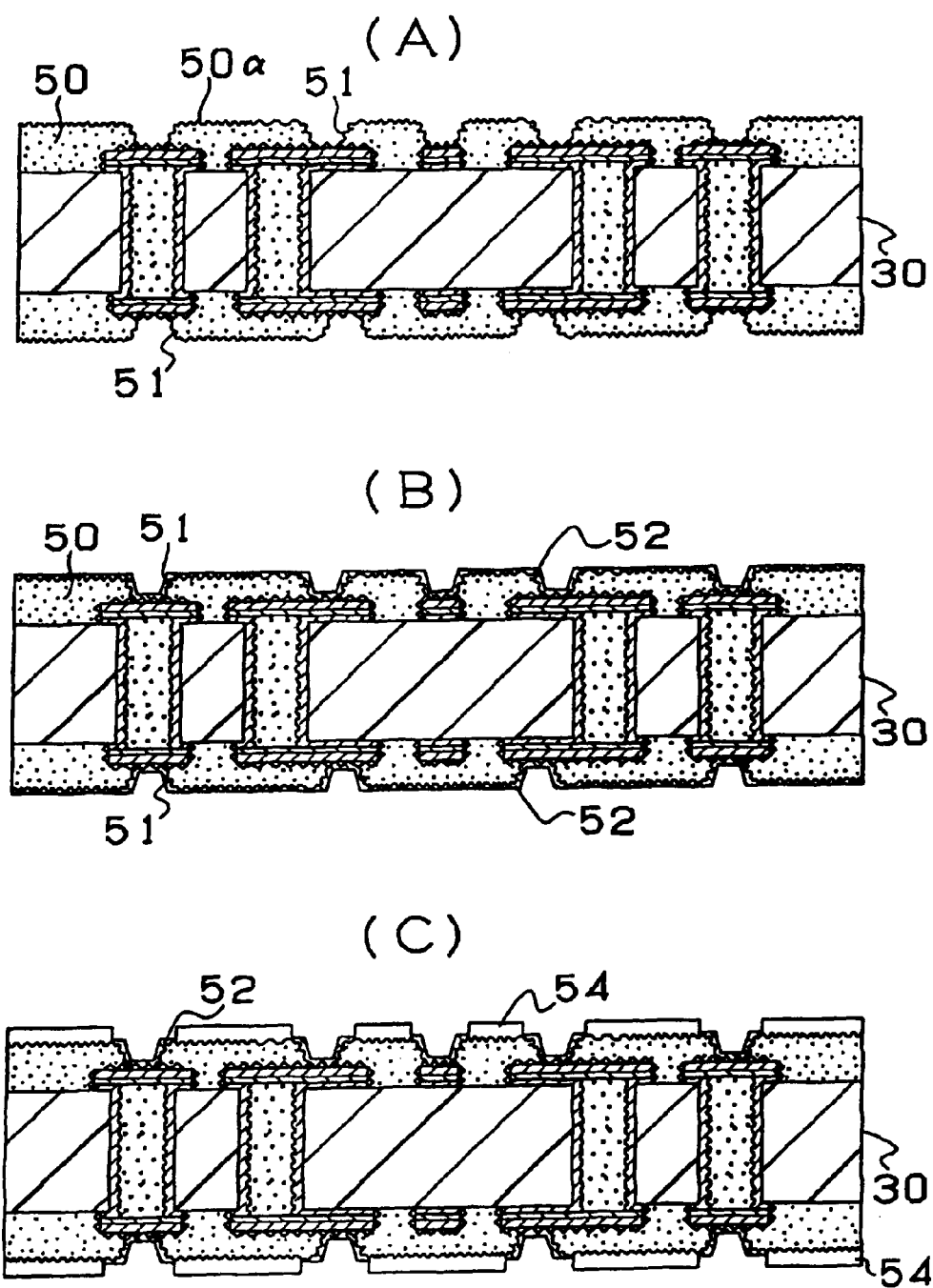
FIGS. 4(A)-4(C) are cross-sectional views of the multi-layer printed wiring board during the manufacturing process.
Figure 5:
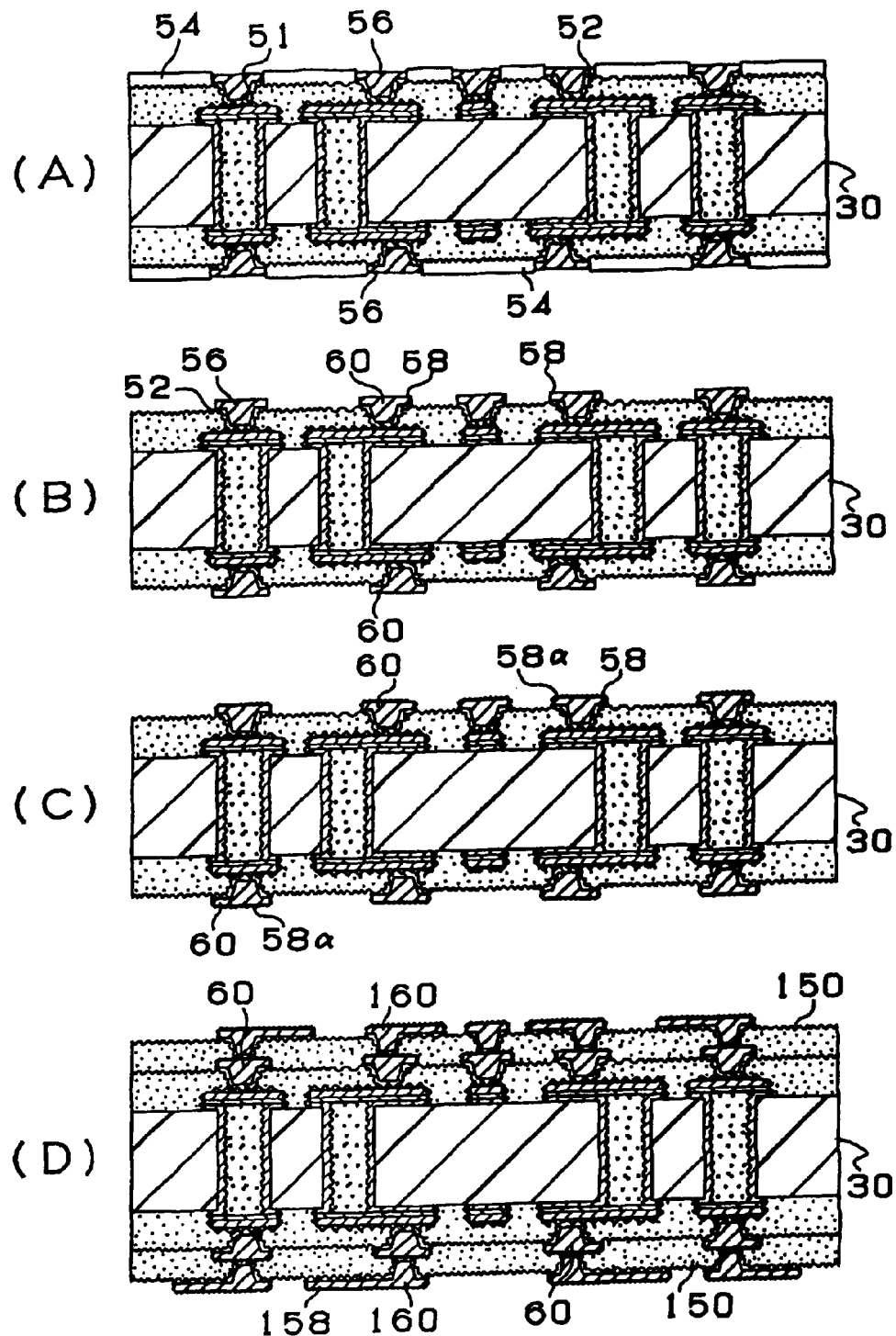
FIGS. 5(A)-5(D) are cross-sectional views of the multi-layer printed wiring board during the manufacturing process.

The embodiments will now be described with reference to the accompanying drawings, wherein like reference numerals designate corresponding or identical elements throughout the various drawings.

Figure 7:
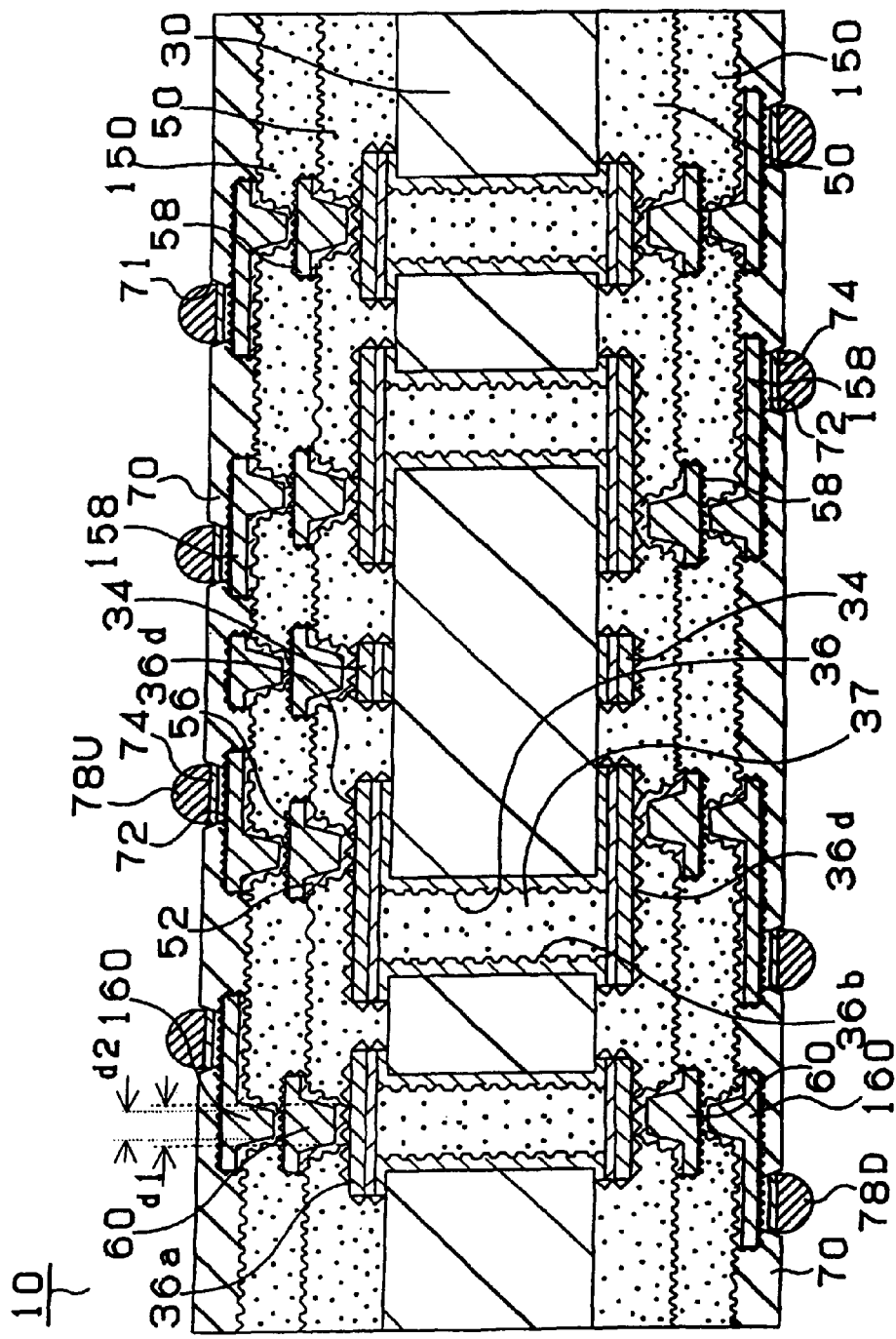
FIG. 7 is a cross-sectional view of a multi-layer printed wiring board according to one embodiment of the present invention.

FIG. 7 is a cross-sectional view of a multi-layer printed wiring board according to one embodiment of the present invention. Referring to FIG. 7, a multi-layer printed wiring board 10 has a core substrate 30, first interlayer insulation layers 50 formed on the core substrate 30, a conductor circuit 34 formed above the core substrate 30, and second interlayer insulation layers 150 formed on the first interlayer insulation layers 50. The front and rear surfaces of the core substrate 30 are connected with each other by a throughhole structure 36. The throughhole structure 36 has a sidewall conductor layer (36b) and cover plated layers (throughhole lands) (36a), (36d) and is filled with a filler 37. The first interlayer insulation layer 50 has a first filled via 60 and a conductor circuit 58, and the second interlayer resin insulation layer 150 has a second filled via 160 and a conductor circuit 158. The first filled via 60 is comprised of a plating film 56 and connected to the cover plated layer (36a) or (36d) through a plating film 52. A resist layer 70 is formed above the second filled via 160 and conductor circuit 158 and has openings 71 where plating layers 72, 74 are formed, and bumps (78U), (78D) are provided on the plating layer 74. The bottom of the first filled via 60 has a diameter (d1), and the bottom of the second filled via 160 has a diameter (d2). In this embodiment, the bottom diameter (d2) of the filled via 160 is made smaller than the bottom diameter (d1) of the filled via 60 formed on the cover-like conductor layer (cover plated layer) (36a) or (36d). As such, the multi-layer printed wiring board 10 has higher connection reliability and higher integration degree by using filled vias of smaller diameters.

Figure 8:
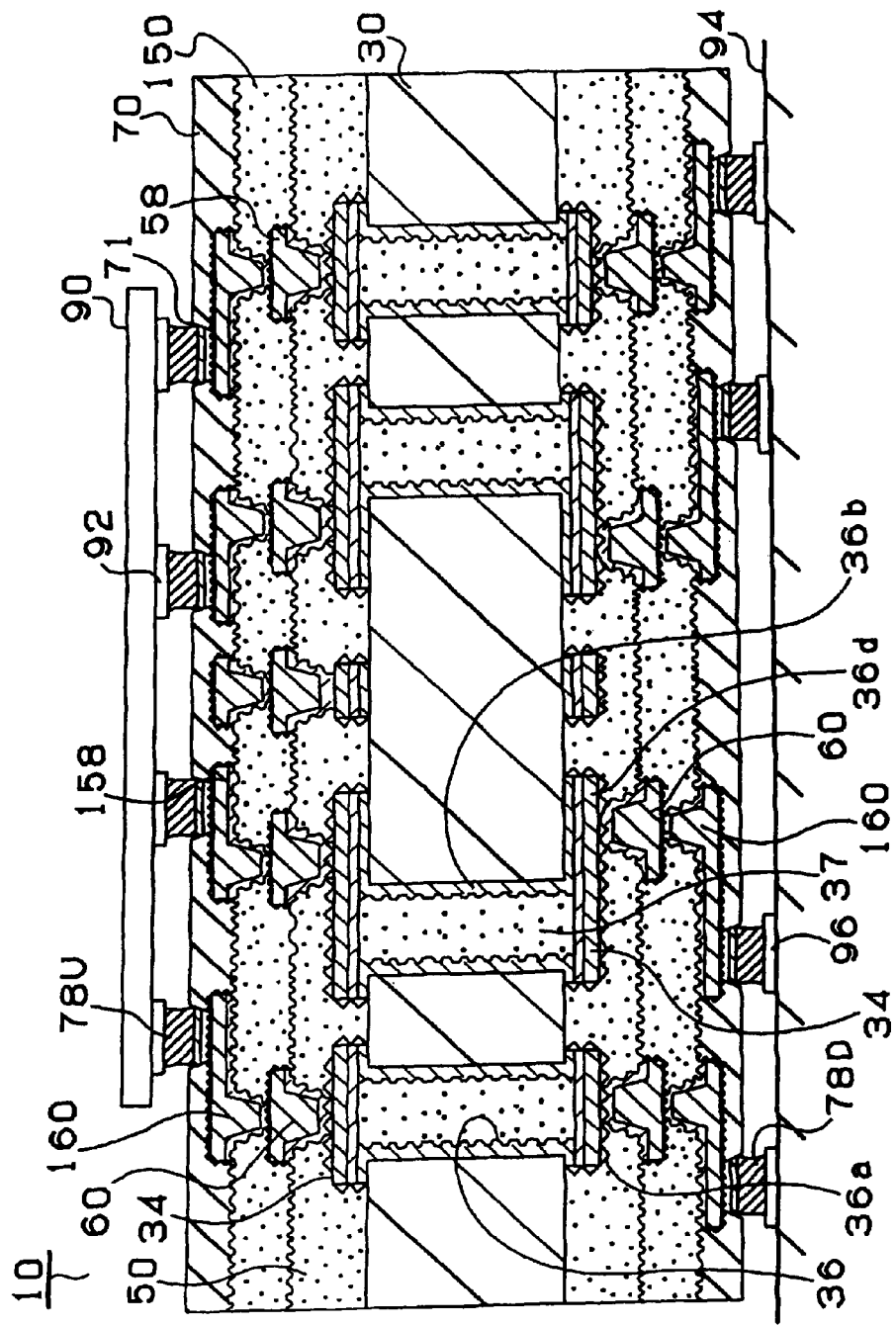
FIG. 8 is a cross-sectional view of a multi-layer printed wiring board according to one embodiment of the present invention with a mounted IC chip.

FIG. 8 is a cross-sectional view of the multi-layer printed wiring board 10 with a mounted IC chip. Referring to FIG. 8, an IC chip 90 is mounted on the multi-layer printed wiring board 10 and the multi-layer printed wiring board 10 is placed on a daughterboard 94. The bump (78U) provided on the front side of the multi-layer printed wiring board 10 is connected to a land 92 of the IC chip 90, while the bump (78D) provided on the rear side is connected to a land 96 of the daughterboard 94.

Figure 9:
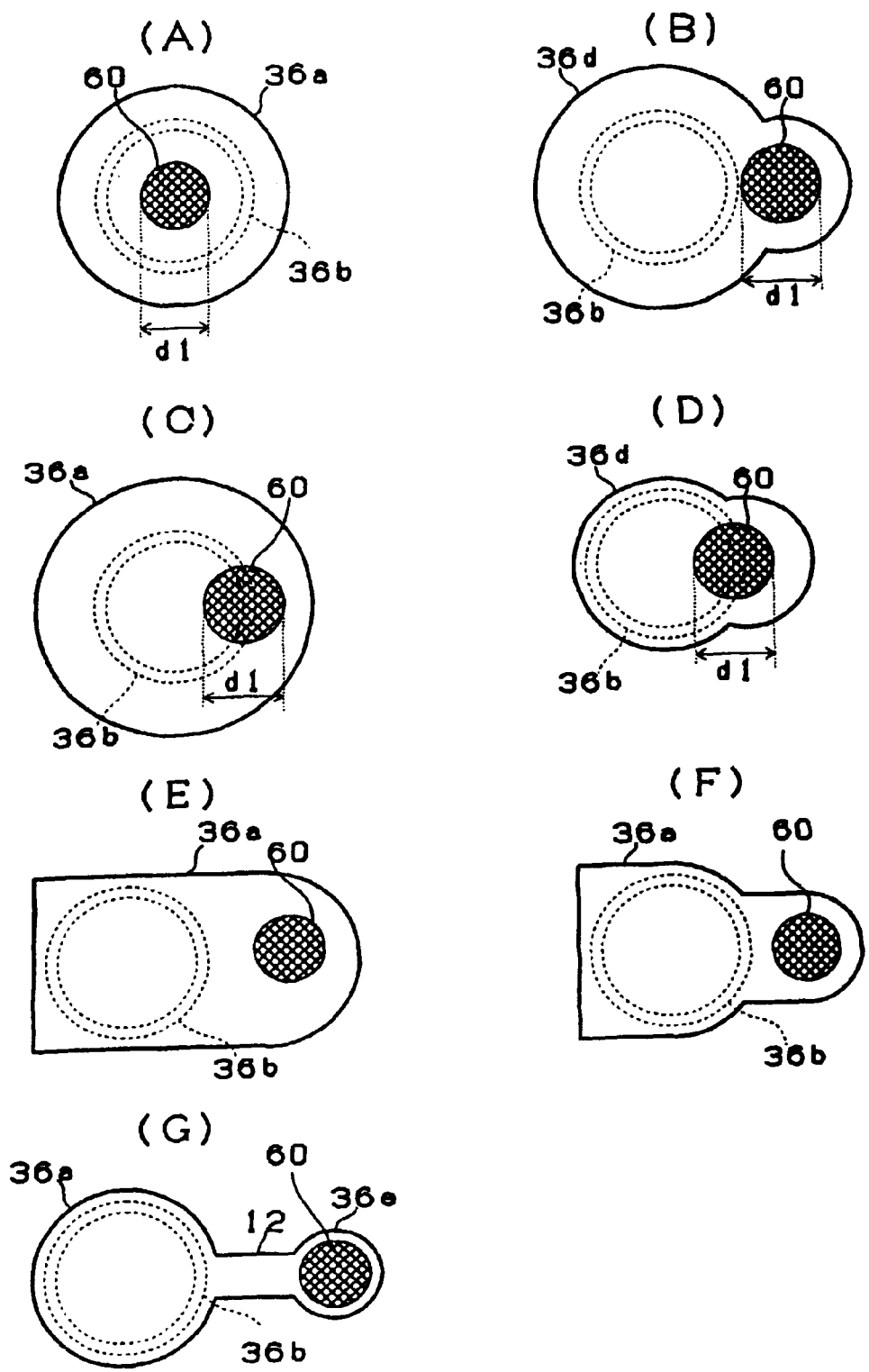
FIGS. 9(A)-9(G) are plan views of cover plated layers provided in a multi-layer printed wiring board according to one embodiment of the present invention.

FIGS. 9(A)-9(G) are plan views of cover plated layers (36a) and (36d) provided in the multi-layer printed wiring board 10. FIG. 9(A) is a plan view of a cover plated layer (throughhole land) (36a). This cover plated layer (36a) has a substantially circular shape, and the first filled via 60 formed above the cover plated layer (36a) is positioned inside the region defined by the sidewall conductor layer (36b) which is shown by the dotted lines in FIG. 9(A). For example, the opening of the throughhole may be made to 0.08 mm~0.25 mm in size with a drill, the bottom of the first filled via 60 provided on the cover plated layer (36a) may have a diameter (d1) of 60 μm, and the bottom of the second filled via 160 formed in the second interlayer insulation layer 150 above the first filled via 60 may have a diameter (d2) of 45 μm. FIG. 9(B) is a plan view of a cover plated layer (throughhole land) (36d). This cover plated layer (36d) is snowman-shaped (i.e., two semicircles are combined). The bottom section of the first filled via 60 on the cover plated layer (36d) is formed at a portion which is not above a throughhole and positioned outside the region defined by the sidewall conductor layer (36b). For instance, the bottom of the first filled via 60 provided on the cover plated layer (36d) may have a diameter (d1) of 60 μm, and the bottom of the second filled via 160 formed right above the first filled via 60 may have a diameter (d2) of 45 μm.

FIG. 9(C) and FIG. 9(D) are plan views of cover plated layers (36a) and (36d) having other shapes. In FIG. 9(C), the cover plated layer (36a) is made substantially circular, and the first filled via 60 is formed at a portion above the sidewall conductor layer (36b). In FIG. 9(D), the cover plated layer (36d) has a snowman-like shape, and the first filled via 60 is formed at a portion above the sidewall conductor layer (36b).

FIG. 9(E) and FIG. 9(F) are plan views of cover plated layers (36a) and (36d) formed in different shapes. As shown in these figures, the cover plated layers (36a) and (36d) are not necessarily a part of a circle, and the cover plated layer (36a) or (36d) may be formed to have a portion covering the throughhole and a horizontally protruding portion where a first filled via 60 is formed. When the cover plated layer (36a) or (36d) has such a shape, throughholes may be positioned at a narrower pitch.

FIG. 9(G) is another plan view showing a first filled via 60 formed above a land portion (36e), and the land portion (36e) of the first filled via 60 is connected with the cover plated layer (36a) and the sidewall conductor layer (36b) of a throughhole with wiring 12. In these instances, the diameter of the first filled via 60 is preferably made larger than the diameter of the second filled via 160 so as to achieve higher connection reliability.

FIGS. 10(A) and 10(B) are schematic illustrations showing filled vias provided in the multi-layer printed wiring board 10. The term "filled via" is used to mean a via whose concave depth (P1) (extent of a dent from the upper end face) is 7 μm or less as shown in FIG. 10(A) and a via whose convex height (P2) (extent of a bump from the upper flat surface) is 7 μm or less as shown in FIG. 10(B).

As discussed above, the multi-layer printed wiring board 10 of the present embodiment is provided with a filled via 160 which has a bottom diameter (d2) smaller than the bottom diameter (d1) of the filled via 60 formed on the cover plated layer (36a) or (36d). If stress is applied to the first filled via 60 formed on the cover plated layer (36a) or (36d), the cover plated layer (36a) or (36d) is likely to deform to a larger extent and in a more complicated manner, because the throughhole structure 36 and the insulative core substrate 30 have different physical properties. Therefore, the bottom of the first filled via may tend to receive larger stress compared to the bottom of the second filled via. In the present embodiment, the bottom diameter (d2) of the filled via 160 is made smaller than the bottom diameter (d1) of the filled via 60 formed on the cover-like conductor layers (cover plated layers) (36a) and (36d), and it is thus believed that the multi-layer printed wiring board 10 achieves higher connection reliability.

FIGS. 1(A)-6(B) are cross-sectional views of a multi-layer printed wiring board during a manufacturing process according to one embodiment of the present invention. Referring to FIGS. 1(A)-6(B), a method of producing the multi-layer printed wiring board is discussed below.

(1) As shown in FIG. 1(A), a laminated plate (30A) is formed by laminating a metal film 32 on front and rear surfaces of a core substrate 30. For example, the laminated plate (30A) may be a copper clad laminated plate formed by laminating copper foils of 5~250 μm on the surfaces of an insulative substrate of 0.2~0.8 mm in thickness made of glass epoxy resin or BT (Bismaleimide-Triazine) resin. As illustrated in FIG. 1(B), the laminated plate (30A) is drilled to make throughhole openings 16. Then, as shown in FIG. 1(C), electroless plating and electrolytic plating (see processes (13) and (15) for exemplary plating solution and conditions below) are carried out to form the sidewall conductor layer (36b) of the throughhole structure 36. For instance, the opening of the throughhole opening 16 may be set to 0.1~0.25 mm ○ with a drill, and the pitch of the throughhole openings 16 may be set to 0.15~0.575 mm.

(2) After the core substrate 30 having the throughhole structure 36 is washed with water and dried, the entire exposed surface of the metal film 32 including the sidewall conductor layer (36b) is roughened to form coarse surfaces (36a) as illustrated in FIG. 1(D). For example, the coarse surfaces (36a) may be formed by black oxide treatment using as black oxidizing solution (oxidizing bath) an aqueous solution containing NaOH (10 g/L), NaClO$_2$ (40 g/L), Na$_3$PO$_4$ (6 g/L) and by reduction treatment using as reduction bath an aqueous solution containing NaOH (10 g/L) and NaBH$_4$ (6 g/L).

(3) Next, as shown in FIG. 2(A), the throughhole structure 36 is filled with a filler 37 by using, for example, a screen printing method and then dried and solidified. One example of the filler 37 is non-conductive copper filling paste (made by Tatsuta Electric Wire & Cable Co., Ltd.; brand name, DD paste) containing copper particles of 10 μm in average diameter. The throughhole structure 36 may be filled with the filler 37 by applying filler material to the core substrate 30 having masks with openings at throughhole portions by using a printing method, and subsequently drying and solidifying the filler material. Then, the filler 37 that sticks out from the throughhole structure 36 is removed by, for instance, belt sander grinding using #600 belt polishing paper (made by Sankyo Rikagaku Co., Ltd.). Buffing for removing scratches caused by the belt sander grinding is conducted to smooth out the surfaces of the core substrate 30 as illustrated in FIG. 2(B). The core substrate 30 thus formed has the throughhole structure 36 having the sidewall conductor layer (36b) and the filler 37 tightly attached to each other through the coarse surfaces (36a). Instead of using the filler as discussed above, the throughhole structure 36 may be filled with the same material as the sidewall conductor layer (36b).

(4) A catalyst, for example, palladium catalyst (made by Atotec Japan Co., Ltd.) is applied to the surface of the core substrate 30 that has been smoothed out in the above process (3). Then, as shown in FIG. 2(C), the core substrate 30 is subjected to electroless plating to form an electroless plating film 23. The electroless plating may be electroless copper plating to form an electroless copper plating film of 0.6 μm in thickness.

(5) In the process of FIG. 2(D), electrolytic plating is carried out to form an electrolytic plating film 24 which becomes the conductor circuit 34 and the cover plated layers (throughhole lands) (36a) and (36d) covering the filler 37 of the throughhole structure 36. As an example, electrolytic copper plating may be carried out under the conditions as shown below to form an electrolytic copper plating film of 15 μm in thickness.

[Aqueous Electrolytic Plating Solution]

| Sulfuric acid | 180 g/L |
| Copper sulfate | 80 g/L |

Additive (made by Atotec Japan; brand name, Caparasid GL) 1 mL/L

[Electrolytic Plating Conditions]

| Current density | 1 A/dm$^2$ |
| Time | 30 minutes |
| Temperature | room temperature |

(6) In the process of FIG. 2(E), an etching resist 25 is formed on selected portions of the electrolytic plating film 24 formed on both surfaces of the core substrate 30. For instance, the etching resist 25 may be formed as follows: a commercially available photosensitive dry film is attached to the electrolytic plating film 24, a mask having an appropriate pattern is placed thereon, the core substrate 30 is exposed to light (100 mJ/cm$^2$) and developed with 0.8% sodium carbonate to form an etching resist of 15 μm in thickness. By varying the patterns formed on the mask, the cover plated layer (36a) or (36d) may be formed to have one of the shapes shown in FIG. 9(A)~FIG. 9(F), or alternatively the cover plated layer (36a) or (36d) may be formed to have different shapes depending on the positions. The cover plated layers (36a) and (36d) may possibly have shapes other than those illustrated in FIG. 9(A)~FIG. 9(F). When the cover plated layer (36a) is shaped as in FIG. 9(A), the first filled via 60 is formed inside the inner wall of the sidewall conductor layer (36b), and if the throughhole structure 36 is filled with the same material as the sidewall conductor layer (36b), the first filled via 60 is positioned inside an area under which the throughhole opening 16 is formed. Also, when the cover plated layers (36a) and (36d) are formed to have shapes as shown in FIG. 9(C) and FIG. 9(D), respectively, and if the throughhole structure 36 is filled with the same material as the sidewall conductor layer (36b) (e.g., copper (may be a combination of electroless copper and electrolytic copper) or conductive paste), the first filled via 60 is formed above the throughhole opening 16.

(7) FIG. 3(A) shows the core substrate 30 where the electroless plating film 23, electrolytic plating film 24 and metal film 32 are removed from the sections where no etching resist 25 has been formed in FIG. 2(E). For the removal, an etching solution mainly containing cupric chloride (CuCl$_2$) may be used. Then, the etching resist 25 is removed with, for example, 5% KOH to form independent conductor circuit 34 and cover plated layers (36a) and (36d) covering the filler 37. This method is referred to as a tenting method.

(8) As shown in FIG. 3(B), the entire exposed surface of the conductor circuit 34 and the cover plated layers (36a) and (36d) including their side surfaces is roughened to form a coarse layer (textured layer) (340). The coarse layer (340) may be a layer of 2.5 μm in thickness made of an Cu—Ni—P alloy. Then, on the surface of the coarse layer (34β), a Sn layer having a thickness of 0.3 μm is formed (not shown).

(9) In the process of FIG. 3(C), the interlayer resin insulation layers 50 are formed on the core substrate 30. For instance, the interlayer insulation layers 50 may be formed by the following method: a resin film (50γ) (made by Ajinomoto Co., Inc.; brand name, ABF-45SH), which is slightly larger than the core substrate 30, is placed on the front and rear surfaces of the core substrate 30; the resin film (50γ) is preliminarily attached to the core substrate 30 under the conditions of 0.45 MPa (pressure), 80° C. (temperature), and 10 seconds (pressure bond time) and then sheared; and the resin film (50γ) is completely attached by using a vacuum laminator under the conditions of 67 Pa (degree of vacuum), 0.47 MPa (pressure), 85° C. (temperature), and 60 seconds (pressure bond time), followed by thermosetting for 40 minutes at 170° C.

(10) As illustrated in FIG. 3(D), openings 51 to be the first via holes 60 are formed in the first interlayer insulation layers 50. The openings 61 may be formed by using $CO_2$ gas laser (wavelength: 10.4 μm) under the conditions of 4.0 mm (beam radius), a top hat mode, 3~30 μsec (pulse width), 1.0~5.0 mm (radius of the open hole of a mask), and 1~3 shots. The laser conditions are adjusted so that a via hole is formed to have a target bottom diameter. For example, the laser conditions are adjusted so that the bottom diameter of the first via hole 60 becomes ○60 μm.

(11) In the next step of FIG. 4(A), the entire exposed surface of the first interlayer insulation layer 50 including the inner walls of the openings 51 is roughened to form a coarse surface (50α). The coarse surface (50α) may be formed as follows: the core substrate 30 in which the openings 51 have been formed is immersed in a solution containing 60 g/L of permanganic acid for ten minutes at 80° C. to remove epoxy resin particles remaining on the surface of the first interlayer insulation layer 50. The depth of the coarseness of the coarse surface (50α) may be 3 μm.

(12) The core substrate 30 is then immersed in a neutralizing solution, for example, the neutralizing solution made by Shipley Company L.L.C. and then washed with water. Furthermore, the nucleus of a catalyst is attached to the surface of the first interlayer insulation layer 50 and the inner walls of the openings 51 by, for example, applying a palladium catalyst to the coarse surface (50α). As an example, the core substrate may be immersed in a catalyst solution containing palladium chloride ($PbCl_2$) and stannous chloride ($SnCl_2$) in order to deposit metal palladium, thereby providing the catalyst.

(13) Then, as illustrated in FIG. 4(B), an electroless plating film 52 is formed on the entire coarse surface (50α) including the inner walls of the openings 51. One method to form the electroless plating film 52 is to immerse the core substrate 30 provided with the catalyst in an aqueous electroless copper plating solution (Thrucup PEA; manufactured by Uemura & Co. Ltd.) to form an electroless copper plating film of 0.3~3.0 μm in thickness.

[Electroless Plating Conditions]

At 34° C. (liquid temperature) for 45 minutes.

(14) FIG. 4(C) shows a plating resist 54 formed on selected portions of the electroless plating film 52. For example, the plating resist 54 may be formed as follows: a commercially available photosensitive dry film is attached onto the core substrate 30 on which the electroless plating film 52 has been formed, a mask is placed thereon, and the core substrate 30 is exposed to light (110 mJ/cm$^2$) and developed with 0.8% sodium carbonate aqueous solution to form a plating resist of 25 μm in thickness.

(15) FIG. 5(A) shows an electrolytic plating film 56 formed on the electroless plating film 52. As an example, the electrolytic plating film 56 may be formed by the following process: the core substrate 30 is washed with water at 50° C. to remove grease, washed with water at 25° C. and then with sulfuric acid, and subsequently the core substrate 30 is subjected to electrolytic plating. Exemplary electrolytic plating solution and conditions are provided below.

[Electrolytic Plating Solution]

| | |
|---|---|
| Sulfuric acid | 2.24 mol/L |
| Copper sulfate | 0.26 mol/L |
| Additive | 19.5 mL/L |
| Leveling agent | 50 mg/L |
| Brightening agent | 50 mg/L |

[Electrolytic Plating Conditions]

| | |
|---|---|
| Current density | 1 A/dm$^2$ |
| Time | 70 minutes |
| Temperature | 22 ± 2° C. |

(16) As shown in FIG. 5(B), the plating resist 54 and the electroless plating film 52 under the plating resist 54 are removed to form a conductor circuit 58 and a first filled via 60. The removing steps may be performed as follows: after removing the plating resist 54 with 5% KOH, the electroless plating film 52 under the plating resist 54 is removed by an etching process using a mixture of sulfuric acid and hydrogen peroxide.

(17) Then, as illustrated in FIG. 5(C), the entire exposed surface of the conductor circuit 58 and first filled via 60 including side surfaces is roughened to form a coarse surface (58α). The roughening may be performed by using the same method as in the above process (4). The conductor circuit 58 is, for example, 15 μm in thickness, and the thickness may be 5~25 μm.

(18) FIG. 5(D) shows a second interlayer insulation layer 150 which is formed on the first interlayer insulation layer 50 and has a conductor circuit 158 and a second filled via 160. The second interlayer insulation layer 150 may be formed by repeating the above processes (9)~(17). The bottom diameter of the second filled via 160 is, for example, 45 μm.

(19) Next, as illustrated in FIG. 6(A), a resist layer 70 having openings 71 is formed on coarse surfaces of the second interlayer insulation layer 150, conductor circuit 158 and second filled via 160. The resist layer 70 may be formed as follows: a commercially available solder resist material is applied in the thickness of 20 μm to surfaces of the second interlayer insulation layer 150, conductor circuit 158 and second filled via 160, and dried for 20 minutes at 70° C. followed by 30 minutes at 70° C. After tightly attaching to the resist material a photo mask of 5 mm in thickness on which a pattern of openings of the solder resist is drawn, the resist material is exposed to ultraviolet rays (1000 mJ/cm$^2$) and then developed with DMTG solution to form openings of 200 μm in diameter. Then, the resist material is solidified by heat processes at 80° C. for one hour, at 100° C. for one hour, at 120° C. for one hour, and at 150° C. for three hours to form the resist layer 70 having a thickness of 15~25 μm and the openings 71.

(20) FIG. 6(B) shows plating layers 72, 74 formed in the openings 71. As an example, the plating layers 72, 74 may be a nickel plating layer 72, and a gold plating layer 74, respectively, formed by the following method: the substrate having the resist layer 70 is immersed in an electroless nickel plating solution (pH 4.5) containing nickel chloride (2.3×10$^{-1}$ mol/L), sodium hypophosphite (2.8×10$^{-1}$ mol/L), and sodium citrate (1.6×10$^{-1}$ mol/L) to form the nickel plating layer 72 (5 μm in thickness) in the opening 71. Subsequently, the substrate is immersed in an electroless gold plating solution containing gold potassium cyanide (7.6×10$^{-3}$ mol/L), ammonium chloride (1.9×10$^{-1}$ mol/L), sodium citrate (1.2×10$^{-1}$ mol/L), and sodium hypophosphite (1.7×10$^{-1}$ mol/L) for 7.5 minutes at 80° C. to form the gold plating layer 74 of 0.03 μm in thickness on the nickel plating layer 72. Other than the nickel and gold layers, a single layer of Sn or precious metal (gold, silver, palladium, platinum, etc.) may be formed.

(21) Then, the multi-layer printed wiring board 10 shown in FIG. 7 is made by forming bumps (78U) and (78D) in the openings 71. These bumps (78U) and (78D) may be formed as follows: the openings 71 formed in the resist layer 70 formed on the front side of the substrate for mounting an IC chip is printed with solder paste containing Sn—Pb. After that, the openings 71 of the resist layer 70 on the other side of the substrate is printed with solder paste containing Sn—Sb. Then, solder bumps (solder bodies) are formed by reflow soldering at 200° C.

Next, as shown in FIG. 8, an IC chip 90 is mounted through the bumps (78U), and then the multi-layer printed wiring board 10 is mounted on the daughterboard 94 through the bumps (78D).

EXAMPLES 1~120 AND COMPARATIVE EXAMPLES 1~6

Various examples of the multi-layer printed wiring board were produced based on the manufacturing method as discussed above, and the electric resistance changes after repeatedly heating and cooling the multi-layer printed wiring boards were examined. In the exemplary multi-layer printed wiring boards, variations were made in (a) the bottom diameter of the first filled via 60, (b) the bottom diameter of the second filled via 160, (c) the shape of the land portion of the first filled via 60 (see FIGS. 9(A)-9(G)), and (d) the position of the first filled via 60. As to the position of the first filled via 60, Types (i)-(iv) were made:

(i) on the cover plated layer (36a) and inside the area under which the throughhole opening 16 is provided (see FIG. 9(A));

(ii) on the land portion (36e) (see FIG. 9(G));

(iii) on the cover plated layer (36d) and outside the area under which the throughhole opening 16 is made (see FIG. 9(B)); and (iv) on the cover plated layer (36a) or (36d) and over an area under which the sidewall conductor layer (36b) (see FIG. 9(C) and FIG. 9(D)).

In producing the multi-layer printed wiring boards of Examples 1~120 and Comparative Examples 1~6, (a) the bottom diameter of the first filled via 60, (b) the bottom diameter of the second filled via 160, (c) the shape of the land portion of the first filled via 60, and (d) the position of the first filled via 60 were varied in the following methods. Specifically, the diameter of the throughhole opening 16 was varied, as described in the process (1) by referring to FIG. 1(B), by changing the diameter of the drill used for drilling. The pitch was varied by inputting data on drilling position into the drill. The bottom diameters of the first and second filled vias were altered by adjusting the laser conditions as described above in the process (10). The positions of the first and second filled vias were changed by inputting data on via hole opening position into a laser processing machine in accordance with the shape of the land of the filled via and the position of the land. The shape of the land of the first filled via was changed by adjusting the pattern of a mask as described in the process (6) by referring to FIG. 2(E). An IC chip was then mounted on each multi-layer printed wiring board of Examples 1~120 and Comparative Examples 1~6. After that, sealing resin was filled in between the IC chip and the multi-layer printed wiring board to make a substrate mounted with an IC chip. The electric resistance of a specific circuit via the IC chip (electric resistance between a pair of electrodes that was electrically connected to the IC chip and exposed on the surface of the IC-mounted substrate opposite to the surface where the IC chip was mounted) was measured and set as an initial value. Then, a heat cycle test was conducted on those IC-mounted substrates for 2500 cycles (one cycle: −55 degrees for 5 minutes and 125 degrees for 5 minutes). The electric resistance was measured at the 500th, 1000th, 1250th, 1500th, 1750th, 2000th, and 2500th cycle of the heat cycle test to find the rate of change relative to the initial value (100×(measured value−initial value)/initial value (%)). The test results are provided in Tables 1-4. In Tables 1-4, the rate of change in the electric resistance is indicated as follows: "good" (○) if the rate of change was ±5% or less; "normal" (Δ) if it was ±5~10%; and "poor" (X) if it exceeded ±10. The target specification was such that the rate of change was ±10% or less (i.e., "good" or "normal" in assessment) at the 1000th cycle. "Acceptable" ones were ±10% or less.

TABLE 1

| # | Radius of throughhole R (μm) | Throughhole pitch | Diameter of bottom of second filled via (μm) | Diameter of bottom of first filled via (μm) | Position of first filled via | \multicolumn{7}{c}{Results of heat cycle test} | First/ second |
|---|---|---|---|---|---|---|---|---|---|---|---|---|---|
|   |   |   |   |   |   | 500 | 1000 | 1250 | 1500 | 1750 | 2000 | 2500 |   |
| Example 1 | 50 | 150 | 30 | 35 | (i) | ○ | ○ | ○ | ○ | ○ | ○ | X | 1.167 |
| Example 2 | 50 | 150 | 30 | 35 | (ii) | ○ | ○ | Δ | Δ | X | X | X | 1.167 |
| Example 3 | 50 | 150 | 30 | 35 | (iii) | ○ | ○ | ○ | ○ | Δ | X | X | 1.167 |
| Example 4 | 50 | 150 | 30 | 35 | (iv) | ○ | ○ | Δ | X | X | X | X | 1.167 |
| Example 5 | 50 | 150 | 30 | 40 | (i) | ○ | ○ | ○ | ○ | ○ | ○ | ○ | 1.333 |
| Example 6 | 50 | 150 | 30 | 40 | (ii) | ○ | ○ | Δ | Δ | X | X | X | 1.333 |
| Example 7 | 50 | 150 | 30 | 40 | (iii) | ○ | ○ | ○ | ○ | Δ | X | X | 1.333 |
| Example 8 | 50 | 150 | 30 | 40 | (iv) | ○ | ○ | Δ | X | X | X | X | 1.333 |
| Example 9 | 50 | 150 | 30 | 45 | (i) | ○ | ○ | ○ | ○ | ○ | ○ | ○ | 1.5 |
| Example 10 | 50 | 150 | 30 | 45 | (ii) | ○ | ○ | Δ | Δ | X | X | X | 1.5 |
| Example 11 | 50 | 150 | 30 | 45 | (iii) | ○ | ○ | ○ | ○ | Δ | X | X | 1.5 |
| Example 12 | 50 | 150 | 30 | 45 | (iv) | ○ | ○ | Δ | X | X | X | X | 1.5 |
| Example 13 | 50 | 150 | 30 | 50 | (i) | ○ | ○ | ○ | ○ | ○ | ○ | ○ | 1.667 |
| Example 14 | 50 | 150 | 30 | 50 | (ii) | ○ | ○ | Δ | Δ | X | X | X | 1.667 |
| Example 15 | 50 | 150 | 30 | 50 | (iii) | ○ | ○ | ○ | ○ | Δ | X | X | 1.667 |
| Example 16 | 50 | 150 | 30 | 50 | (iv) | ○ | ○ | Δ | X | X | X | X | 1.667 |
| Example 17 | 50 | 150 | 30 | 60 | (i) | ○ | ○ | ○ | ○ | ○ | ○ | X | 2 |
| Example 18 | 50 | 150 | 30 | 60 | (ii) | ○ | ○ | Δ | Δ | X | X | X | 2 |
| Example 19 | 50 | 150 | 30 | 60 | (iii) | ○ | ○ | ○ | ○ | Δ | X | X | 2 |
| Example 20 | 50 | 150 | 30 | 60 | (iv) | ○ | ○ | Δ | X | X | X | X | 2 |
| Example 21 | 50 | 150 | 30 | 65 | (i) | ○ | ○ | ○ | ○ | ○ | ○ | X | 2.167 |
| Example 22 | 50 | 150 | 30 | 65 | (ii) | ○ | ○ | Δ | Δ | X | X | X | 2.167 |
| Example 23 | 50 | 150 | 30 | 65 | (iii) | ○ | ○ | ○ | ○ | Δ | X | X | 2.167 |
| Example 24 | 50 | 150 | 30 | 65 | (iv) | ○ | ○ | Δ | X | X | X | X | 2.167 |
| Example 25 | 50 | 150 | 45 | 50 | (i) | ○ | ○ | ○ | ○ | ○ | ○ | X | 1.111 |
| Example 26 | 50 | 150 | 45 | 50 | (ii) | ○ | ○ | Δ | Δ | X | X | X | 1.111 |
| Example 27 | 50 | 150 | 45 | 50 | (iii) | ○ | ○ | ○ | ○ | Δ | X | X | 1.111 |
| Example 28 | 50 | 150 | 45 | 50 | (iv) | ○ | ○ | Δ | X | X | X | X | 1.111 |
| Example 29 | 50 | 150 | 45 | 60 | (i) | ○ | ○ | ○ | ○ | ○ | ○ | ○ | 1.333 |
| Example 30 | 50 | 150 | 45 | 60 | (ii) | ○ | ○ | Δ | Δ | X | X | X | 1.333 |
| Example 31 | 50 | 150 | 45 | 60 | (iii) | ○ | ○ | ○ | ○ | Δ | X | X | 1.333 |
| Example 32 | 50 | 150 | 45 | 60 | (iv) | ○ | ○ | Δ | X | X | X | X | 1.333 |
| Example 33 | 50 | 150 | 45 | 65 | (i) | ○ | ○ | ○ | ○ | ○ | ○ | ○ | 1.444 |

TABLE 2

| # | Radius of throughhole R (μm) | Throughhole pitch | Diameter of bottom of second filled via (μm) | Diameter of bottom of first filled via (μm) | Position of first filled via | \multicolumn{7}{c}{Results of heat cycle test} | First/ second |
|---|---|---|---|---|---|---|---|---|---|---|---|---|---|
|   |   |   |   |   |   | 500 | 1000 | 1250 | 1500 | 1750 | 2000 | 2500 |   |
| Example 34 | 50 | 150 | 45 | 65 | (ii) | ○ | ○ | Δ | Δ | X | X | X | 1.444 |
| Example 35 | 50 | 150 | 45 | 65 | (iii) | ○ | ○ | ○ | ○ | Δ | X | X | 1.444 |
| Example 36 | 50 | 150 | 45 | 65 | (iv) | ○ | ○ | Δ | X | X | X | X | 1.444 |
| Example 37 | 50 | 150 | 65 | 70 | (i) | ○ | ○ | ○ | ○ | ○ | ○ | X | 1.077 |
| Example 38 | 50 | 150 | 65 | 70 | (ii) | ○ | ○ | Δ | Δ | X | X | X | 1.077 |

TABLE 2-continued

| # | Radius of throughhole R (μm) | Throughhole pitch | Diameter of bottom of second filled via (μm) | Diameter of bottom of first filled via (μm) | Position of first filled via | Results of heat cycle test 500 | 1000 | 1250 | 1500 | 1750 | 2000 | 2500 | First/ second |
|---|---|---|---|---|---|---|---|---|---|---|---|---|---|
| Example 39 | 50 | 150 | 65 | 70 | (iii) | ○ | ○ | ○ | ○ | Δ | X | X | 1.077 |
| Example 40 | 50 | 150 | 65 | 70 | (iv) | ○ | ○ | Δ | X | X | X | X | 1.077 |
| Example 41 | 100 | 192.5 | 30 | 35 | (i) | ○ | ○ | ○ | ○ | ○ | ○ | X | 1.167 |
| Example 42 | 100 | 192.5 | 30 | 35 | (ii) | ○ | ○ | Δ | Δ | X | X | X | 1.167 |
| Example 43 | 100 | 192.5 | 30 | 35 | (iii) | ○ | ○ | ○ | ○ | Δ | X | X | 1.167 |
| Example 44 | 100 | 192.5 | 30 | 35 | (iv) | ○ | ○ | Δ | X | X | X | X | 1.167 |
| Example 45 | 100 | 192.5 | 30 | 40 | (i) | ○ | ○ | ○ | ○ | ○ | ○ | ○ | 1.333 |
| Example 46 | 100 | 192.5 | 30 | 40 | (ii) | ○ | ○ | Δ | Δ | X | X | X | 1.333 |
| Example 47 | 100 | 192.5 | 30 | 40 | (iii) | ○ | ○ | ○ | ○ | Δ | X | X | 1.333 |
| Example 48 | 100 | 192.5 | 30 | 40 | (iv) | ○ | ○ | Δ | X | X | X | X | 1.333 |
| Example 49 | 100 | 192.5 | 30 | 45 | (i) | ○ | ○ | ○ | ○ | ○ | ○ | ○ | 1.5 |
| Example 50 | 100 | 192.5 | 30 | 45 | (ii) | ○ | ○ | Δ | Δ | X | X | X | 1.5 |
| Example 51 | 100 | 192.5 | 30 | 45 | (iii) | ○ | ○ | ○ | ○ | Δ | X | X | 1.5 |
| Example 52 | 100 | 192.5 | 30 | 45 | (iv) | ○ | ○ | Δ | X | X | X | X | 1.5 |
| Example 53 | 100 | 192.5 | 30 | 50 | (i) | ○ | ○ | ○ | ○ | ○ | ○ | ○ | 1.667 |
| Example 54 | 100 | 192.5 | 30 | 50 | (ii) | ○ | ○ | Δ | Δ | X | X | X | 1.667 |
| Example 55 | 100 | 192.5 | 30 | 50 | (iii) | ○ | ○ | ○ | ○ | Δ | X | X | 1.667 |
| Example 56 | 100 | 192.5 | 30 | 50 | (iv) | ○ | ○ | Δ | X | X | X | X | 1.667 |
| Example 57 | 100 | 192.5 | 30 | 60 | (i) | ○ | ○ | ○ | ○ | ○ | ○ | X | 2 |
| Example 58 | 100 | 192.5 | 30 | 60 | (ii) | ○ | ○ | Δ | Δ | X | X | X | 2 |
| Example 59 | 100 | 192.5 | 30 | 60 | (iii) | ○ | ○ | ○ | ○ | Δ | X | X | 2 |
| Example 60 | 100 | 192.5 | 30 | 60 | (iv) | ○ | ○ | Δ | X | X | X | X | 2 |
| Example 61 | 100 | 192.5 | 30 | 65 | (i) | ○ | ○ | ○ | ○ | ○ | ○ | X | 2.167 |
| Example 62 | 100 | 192.5 | 30 | 65 | (ii) | ○ | ○ | Δ | Δ | X | X | X | 2.167 |
| Example 63 | 100 | 192.5 | 30 | 65 | (iii) | ○ | ○ | ○ | ○ | Δ | X | X | 2.167 |
| Example 64 | 100 | 192.5 | 30 | 65 | (iv) | ○ | ○ | Δ | X | X | X | X | 2.167 |
| Example 65 | 100 | 192.5 | 45 | 50 | (i) | ○ | ○ | ○ | ○ | ○ | ○ | X | 1.111 |
| Example 66 | 100 | 192.5 | 45 | 50 | (ii) | ○ | ○ | Δ | Δ | X | X | X | 1.111 |

TABLE 3

| # | Radius of throughhole R (μm) | Throughhole pitch | Diameter of bottom of second filled via (μm) | Diameter of bottom of first filled via (μm) | Position of first filled via | Results of heat cycle test 500 | 1000 | 1250 | 1500 | 1750 | 2000 | 2500 | First/ second |
|---|---|---|---|---|---|---|---|---|---|---|---|---|---|
| Example 67 | 100 | 192.5 | 45 | 50 | (iii) | ○ | ○ | ○ | ○ | Δ | X | X | 1.111 |
| Example 68 | 100 | 192.5 | 45 | 50 | (iv) | ○ | ○ | Δ | X | X | X | X | 1.111 |
| Example 69 | 100 | 192.5 | 45 | 60 | (i) | ○ | ○ | ○ | ○ | ○ | ○ | ○ | 1.333 |
| Example 70 | 100 | 192.5 | 45 | 60 | (ii) | ○ | ○ | Δ | Δ | X | X | X | 1.333 |
| Example 71 | 100 | 192.5 | 45 | 60 | (iii) | ○ | ○ | ○ | ○ | Δ | X | X | 1.333 |
| Example 72 | 100 | 192.5 | 45 | 60 | (iv) | ○ | ○ | Δ | X | X | X | X | 1.333 |
| Example 73 | 100 | 192.5 | 45 | 65 | (i) | ○ | ○ | ○ | ○ | ○ | ○ | ○ | 1.444 |
| Example 74 | 100 | 192.5 | 45 | 65 | (ii) | ○ | ○ | Δ | Δ | X | X | X | 1.444 |
| Example 75 | 100 | 192.5 | 45 | 65 | (iii) | ○ | ○ | ○ | ○ | Δ | X | X | 1.444 |
| Example 76 | 100 | 192.5 | 45 | 65 | (iv) | ○ | ○ | Δ | X | X | X | X | 1.444 |
| Example 77 | 100 | 192.5 | 65 | 70 | (i) | ○ | ○ | ○ | ○ | ○ | ○ | X | 1.077 |
| Example 78 | 100 | 192.5 | 65 | 70 | (ii) | ○ | ○ | Δ | Δ | X | X | X | 1.077 |
| Example 79 | 100 | 192.5 | 65 | 70 | (iii) | ○ | ○ | ○ | ○ | Δ | X | X | 1.077 |
| Example 80 | 100 | 192.5 | 65 | 70 | (iv) | ○ | ○ | Δ | X | X | X | X | 1.077 |
| Example 81 | 125 | 225 | 30 | 35 | (i) | ○ | ○ | ○ | ○ | ○ | ○ | X | 1.167 |
| Example 82 | 125 | 225 | 30 | 35 | (ii) | ○ | ○ | Δ | Δ | X | X | X | 1.167 |
| Example 83 | 125 | 225 | 30 | 35 | (iii) | ○ | ○ | ○ | ○ | Δ | X | X | 1.167 |
| Example 84 | 125 | 225 | 30 | 35 | (iv) | ○ | ○ | Δ | X | X | X | X | 1.167 |
| Example 85 | 125 | 225 | 30 | 40 | (i) | ○ | ○ | ○ | ○ | ○ | ○ | ○ | 1.333 |
| Example 86 | 125 | 225 | 30 | 40 | (ii) | ○ | ○ | Δ | Δ | X | X | X | 1.333 |
| Example 87 | 125 | 225 | 30 | 40 | (iii) | ○ | ○ | ○ | ○ | Δ | X | X | 1.333 |
| Example 88 | 125 | 225 | 30 | 40 | (iv) | ○ | ○ | Δ | X | X | X | X | 1.333 |
| Example 89 | 125 | 225 | 30 | 45 | (i) | ○ | ○ | ○ | ○ | ○ | ○ | ○ | 1.5 |
| Example 90 | 125 | 225 | 30 | 45 | (ii) | ○ | ○ | Δ | Δ | X | X | X | 1.5 |
| Example 91 | 125 | 225 | 30 | 45 | (iii) | ○ | ○ | ○ | ○ | Δ | X | X | 1.5 |
| Example 92 | 125 | 225 | 30 | 45 | (iv) | ○ | ○ | Δ | X | X | X | X | 1.5 |
| Example 93 | 125 | 225 | 30 | 50 | (i) | ○ | ○ | ○ | ○ | ○ | ○ | ○ | 1.667 |
| Example 94 | 125 | 225 | 30 | 50 | (ii) | ○ | ○ | Δ | Δ | X | X | X | 1.667 |
| Example 95 | 125 | 225 | 30 | 50 | (iii) | ○ | ○ | ○ | ○ | Δ | X | X | 1.667 |

TABLE 3-continued

| # | Radius of throughhole R (μm) | Throughhole pitch | Diameter of bottom of second filled via (μm) | Diameter of bottom of first filled via (μm) | Position of first filled via | Results of heat cycle test ||||||| First/second |
|---|---|---|---|---|---|---|---|---|---|---|---|---|---|
| | | | | | | 500 | 1000 | 1250 | 1500 | 1750 | 2000 | 2500 | |
| Example 96 | 125 | 225 | 30 | 50 | (iv) | ○ | ○ | Δ | X | X | X | X | 1.667 |
| Example 97 | 125 | 225 | 30 | 60 | (i) | ○ | ○ | ○ | ○ | ○ | ○ | X | 2 |
| Example 98 | 125 | 225 | 30 | 60 | (ii) | ○ | ○ | Δ | Δ | X | X | X | 2 |
| Example 99 | 125 | 225 | 30 | 60 | (iii) | ○ | ○ | ○ | ○ | Δ | X | X | 2 |

TABLE 4

| # | Radius of throughhole R (μm) | Throughhole pitch | Diameter of bottom of second filled via (μm) | Diameter of bottom of first filled via (μm) | Position of first filled via | Results of heat cycle test ||||||| First/second |
|---|---|---|---|---|---|---|---|---|---|---|---|---|---|
| | | | | | | 500 | 1000 | 1250 | 1500 | 1750 | 2000 | 2500 | |
| Example 100 | 125 | 225 | 30 | 60 | (iv) | ○ | ○ | Δ | X | X | X | X | 2 |
| Example 101 | 125 | 225 | 30 | 65 | (i) | ○ | ○ | ○ | ○ | ○ | ○ | X | 2.167 |
| Example 102 | 125 | 225 | 30 | 65 | (ii) | ○ | ○ | Δ | Δ | X | X | X | 2.167 |
| Example 103 | 125 | 225 | 30 | 65 | (iii) | ○ | ○ | ○ | ○ | Δ | X | X | 2.167 |
| Example 104 | 125 | 225 | 30 | 65 | (iv) | ○ | ○ | Δ | X | X | X | X | 2.167 |
| Example 105 | 125 | 225 | 45 | 50 | (i) | ○ | ○ | ○ | ○ | ○ | ○ | X | 1.111 |
| Example 106 | 125 | 225 | 45 | 50 | (ii) | ○ | ○ | Δ | Δ | X | X | X | 1.111 |
| Example 107 | 125 | 225 | 45 | 50 | (iii) | ○ | ○ | ○ | ○ | Δ | X | X | 1.111 |
| Example 108 | 125 | 225 | 45 | 50 | (iv) | ○ | ○ | Δ | X | X | X | X | 1.111 |
| Example 109 | 125 | 225 | 45 | 60 | (i) | ○ | ○ | ○ | ○ | ○ | ○ | ○ | 1.333 |
| Example 110 | 125 | 225 | 45 | 60 | (ii) | ○ | ○ | Δ | Δ | X | X | X | 1.333 |
| Example 111 | 125 | 225 | 45 | 60 | (iii) | ○ | ○ | ○ | ○ | Δ | X | X | 1.333 |
| Example 112 | 125 | 225 | 45 | 60 | (iv) | ○ | ○ | Δ | X | X | X | X | 1.333 |
| Example 113 | 125 | 225 | 45 | 65 | (i) | ○ | ○ | ○ | ○ | ○ | ○ | ○ | 1.444 |
| Example 114 | 125 | 225 | 45 | 65 | (ii) | ○ | ○ | Δ | Δ | X | X | X | 1.444 |
| Example 115 | 125 | 225 | 45 | 65 | (iii) | ○ | ○ | ○ | ○ | Δ | X | X | 1.444 |
| Example 116 | 125 | 225 | 45 | 65 | (iv) | ○ | ○ | Δ | X | X | X | X | 1.444 |
| Example 117 | 125 | 225 | 32.5 | 70 | (i) | ○ | ○ | ○ | ○ | ○ | ○ | X | 2.154 |
| Example 118 | 125 | 225 | 32.5 | 70 | (ii) | ○ | ○ | Δ | Δ | X | X | X | 2.154 |
| Example 119 | 125 | 225 | 32.5 | 70 | (iii) | ○ | ○ | ○ | ○ | Δ | X | X | 2.154 |
| Example 120 | 125 | 225 | 32.5 | 70 | (iv) | ○ | ○ | Δ | X | X | X | X | 2.154 |
| Comparative 1 | 50 | 150 | 35 | 35 | (i) | Δ | X | X | X | X | X | X | 1 |
| Comparative 2 | 50 | 150 | 70 | 70 | (i) | Δ | X | X | X | X | X | X | 1 |
| Comparative 3 | 100 | 192.5 | 35 | 35 | (i) | Δ | X | X | X | X | X | X | 1 |
| Comparative 4 | 100 | 192.5 | 70 | 70 | (i) | Δ | X | X | X | X | X | X | 1 |
| Comparative 5 | 125 | 225 | 35 | 35 | (i) | ○ | Δ | X | X | X | X | X | 1 |
| Comparative 6 | 125 | 225 | 70 | 70 | (i) | ○ | Δ | X | X | X | X | X | 1 |

Position of the first filled via
(i) On a cover plated layer and inside the area under which a throughhole opening is formed.
(ii) On a land portion (36e). See FIG. 9 (G).
(iii) On a cover plated layer and outside the area under which a throughhole opening is made.
(iv) On a cover plated layer and above an area under which a sidewall conductor layer is formed.

EXAMPLES 121~240 AND "NO. 2 EXAMPLES 1~30"

Multi-layer printed wiring boards of Examples 121~240 were made in the same manner as Examples 1~120, except that the throughhole structures 36 were filled with the same material as the sidewall conductor layer (36b). After mounting IC chips, heat cycle tests were conducted. In these examples, the electrolytic copper plating for forming the electrolytic plating film 56 inside the openings 51 was performed with the current density of 0.1 A/dm². Tables 5-8 show the assessment results of Examples 120~240.

In addition, multi-layer printed wiring boards of "No. 2 Examples 1~30" were made in the same manner as Examples 3, 7, 11 . . . , 115, and 119 (provided with the first filled via 60 on Type (iii) land shape), except that those first filled vias 60 positioned right below the IC chips 90 were formed to have Type (i) land shape. In "No. 2 Examples 1~30", heat cycle tests were also conducted after mounting IC. Then, the results were assessed by measuring connection resistance of a specific circuit containing both of Types (i) and (iii). Table 9 shows the assessment results of "No. 2 Examples 1~30" along with the shapes of filled vias and bottom diameters.

TABLE 5

| # | Radius of throughhole R (μm) | Throughhole pitch | Diameter of bottom of second filled via (μm) | Diameter of bottom of first filled via (μm) | Position of first filled via | Results of heat cycle test | | | | | | | First/ second |
|---|---|---|---|---|---|---|---|---|---|---|---|---|---|
| | | | | | | 500 | 1000 | 1250 | 1500 | 1750 | 2000 | 2500 | |
| Example 121 | 50 | 150 | 30 | 35 | (i) | ○ | ○ | ○ | ○ | ○ | ○ | X | 1.167 |
| Example 122 | 50 | 150 | 30 | 35 | (ii) | ○ | ○ | Δ | Δ | X | X | X | 1.167 |
| Example 123 | 50 | 150 | 30 | 35 | (iii) | ○ | ○ | ○ | ○ | Δ | X | X | 1.167 |
| Example 124 | 50 | 150 | 30 | 35 | (iv) | ○ | ○ | Δ | X | X | X | X | 1.167 |
| Example 125 | 50 | 150 | 30 | 40 | (i) | ○ | ○ | ○ | ○ | ○ | ○ | ○ | 1.333 |
| Example 126 | 50 | 150 | 30 | 40 | (ii) | ○ | ○ | Δ | Δ | X | X | X | 1.333 |
| Example 127 | 50 | 150 | 30 | 40 | (iii) | ○ | ○ | ○ | ○ | Δ | X | X | 1.333 |
| Example 128 | 50 | 150 | 30 | 40 | (iv) | ○ | ○ | Δ | X | X | X | X | 1.333 |
| Example 129 | 50 | 150 | 30 | 45 | (i) | ○ | ○ | ○ | ○ | ○ | ○ | ○ | 1.5 |
| Example 130 | 50 | 150 | 30 | 45 | (ii) | ○ | ○ | Δ | Δ | X | X | X | 1.5 |
| Example 131 | 50 | 150 | 30 | 45 | (iii) | ○ | ○ | ○ | ○ | Δ | X | X | 1.5 |
| Example 132 | 50 | 150 | 30 | 45 | (iv) | ○ | ○ | Δ | X | X | X | X | 1.5 |
| Example 133 | 50 | 150 | 30 | 50 | (i) | ○ | ○ | ○ | ○ | ○ | ○ | ○ | 1.667 |
| Example 134 | 50 | 150 | 30 | 50 | (ii) | ○ | ○ | Δ | Δ | X | X | X | 1.667 |
| Example 135 | 50 | 150 | 30 | 50 | (iii) | ○ | ○ | ○ | ○ | Δ | X | X | 1.667 |
| Example 136 | 50 | 150 | 30 | 50 | (iv) | ○ | ○ | Δ | X | X | X | X | 1.667 |
| Example 137 | 50 | 150 | 30 | 60 | (i) | ○ | ○ | ○ | ○ | ○ | ○ | X | 2 |
| Example 138 | 50 | 150 | 30 | 60 | (ii) | ○ | ○ | Δ | Δ | X | X | X | 2 |
| Example 139 | 50 | 150 | 30 | 60 | (iii) | ○ | ○ | ○ | ○ | Δ | X | X | 2 |
| Example 140 | 50 | 150 | 30 | 60 | (iv) | ○ | ○ | Δ | X | X | X | X | 2 |
| Example 141 | 50 | 150 | 30 | 65 | (i) | ○ | ○ | ○ | ○ | ○ | ○ | X | 2.167 |
| Example 142 | 50 | 150 | 30 | 65 | (ii) | ○ | ○ | Δ | Δ | X | X | X | 2.167 |
| Example 143 | 50 | 150 | 30 | 65 | (iii) | ○ | ○ | ○ | ○ | Δ | X | X | 2.167 |
| Example 144 | 50 | 150 | 30 | 65 | (iv) | ○ | ○ | Δ | X | X | X | X | 2.167 |
| Example 145 | 50 | 150 | 45 | 50 | (i) | ○ | ○ | ○ | ○ | ○ | ○ | X | 1.111 |
| Example 146 | 50 | 150 | 45 | 50 | (ii) | ○ | ○ | Δ | Δ | X | X | X | 1.111 |
| Example 147 | 50 | 150 | 45 | 50 | (iii) | ○ | ○ | ○ | ○ | Δ | X | X | 1.111 |
| Example 148 | 50 | 150 | 45 | 50 | (iv) | ○ | ○ | Δ | X | X | X | X | 1.111 |
| Example 149 | 50 | 150 | 45 | 60 | (i) | ○ | ○ | ○ | ○ | ○ | ○ | ○ | 1.333 |
| Example 150 | 50 | 150 | 45 | 60 | (ii) | ○ | ○ | Δ | Δ | X | X | X | 1.333 |
| Example 151 | 50 | 150 | 45 | 60 | (iii) | ○ | ○ | ○ | ○ | Δ | X | X | 1.333 |
| Example 152 | 50 | 150 | 45 | 60 | (iv) | ○ | ○ | Δ | X | X | X | X | 1.333 |
| Example 153 | 50 | 150 | 45 | 65 | (i) | ○ | ○ | ○ | ○ | ○ | ○ | ○ | 1.444 |

TABLE 6

| # | Radius of throughhole R (μm) | Throughhole pitch | Diameter of bottom of second filled via (μm) | Diameter of bottom of first filled via (μm) | Position of first filled via | Results of heat cycle test | | | | | | | First/ second |
|---|---|---|---|---|---|---|---|---|---|---|---|---|---|
| | | | | | | 500 | 1000 | 1250 | 1500 | 1750 | 2000 | 2500 | |
| Example 154 | 50 | 150 | 45 | 65 | (ii) | ○ | ○ | Δ | Δ | X | X | X | 1.444 |
| Example 155 | 50 | 150 | 45 | 65 | (iii) | ○ | ○ | ○ | ○ | Δ | X | X | 1.444 |
| Example 156 | 50 | 150 | 45 | 65 | (iv) | ○ | ○ | Δ | X | X | X | X | 1.444 |
| Example 157 | 50 | 150 | 65 | 70 | (i) | ○ | ○ | ○ | ○ | ○ | ○ | X | 1.077 |
| Example 158 | 50 | 150 | 65 | 70 | (ii) | ○ | ○ | Δ | Δ | X | X | X | 1.077 |
| Example 159 | 50 | 150 | 65 | 70 | (iii) | ○ | ○ | ○ | ○ | Δ | X | X | 1.077 |
| Example 160 | 50 | 150 | 65 | 70 | (iv) | ○ | ○ | Δ | X | X | X | X | 1.077 |
| Example 161 | 100 | 192.5 | 30 | 35 | (i) | ○ | ○ | ○ | ○ | ○ | ○ | X | 1.167 |
| Example 162 | 100 | 192.5 | 30 | 35 | (ii) | ○ | ○ | Δ | Δ | X | X | X | 1.167 |
| Example 163 | 100 | 192.5 | 30 | 35 | (iii) | ○ | ○ | ○ | ○ | Δ | X | X | 1.167 |
| Example 164 | 100 | 192.5 | 30 | 35 | (iv) | ○ | ○ | Δ | X | X | X | X | 1.167 |
| Example 165 | 100 | 192.5 | 30 | 40 | (i) | ○ | ○ | ○ | ○ | ○ | ○ | ○ | 1.333 |
| Example 166 | 100 | 192.5 | 30 | 40 | (ii) | ○ | ○ | Δ | Δ | X | X | X | 1.333 |
| Example 167 | 100 | 192.5 | 30 | 40 | (iii) | ○ | ○ | ○ | ○ | Δ | X | X | 1.333 |
| Example 168 | 100 | 192.5 | 30 | 40 | (iv) | ○ | ○ | Δ | X | X | X | X | 1.333 |
| Example 169 | 100 | 192.5 | 30 | 45 | (i) | ○ | ○ | ○ | ○ | ○ | ○ | ○ | 1.5 |
| Example 170 | 100 | 192.5 | 30 | 45 | (ii) | ○ | ○ | Δ | Δ | X | X | X | 1.5 |
| Example 171 | 100 | 192.5 | 30 | 45 | (iii) | ○ | ○ | ○ | ○ | Δ | X | X | 1.5 |
| Example 172 | 100 | 192.5 | 30 | 45 | (iv) | ○ | ○ | Δ | X | X | X | X | 1.5 |
| Example 173 | 100 | 192.5 | 30 | 50 | (i) | ○ | ○ | ○ | ○ | ○ | ○ | ○ | 1.667 |
| Example 174 | 100 | 192.5 | 30 | 50 | (ii) | ○ | ○ | Δ | Δ | X | X | X | 1.667 |
| Example 175 | 100 | 192.5 | 30 | 50 | (iii) | ○ | ○ | ○ | ○ | Δ | X | X | 1.667 |
| Example 176 | 100 | 192.5 | 30 | 50 | (iv) | ○ | ○ | Δ | X | X | X | X | 1.667 |
| Example 177 | 100 | 192.5 | 30 | 60 | (i) | ○ | ○ | ○ | ○ | ○ | ○ | X | 2 |
| Example 178 | 100 | 192.5 | 30 | 60 | (ii) | ○ | ○ | Δ | Δ | X | X | X | 2 |
| Example 179 | 100 | 192.5 | 30 | 60 | (iii) | ○ | ○ | ○ | ○ | Δ | X | X | 2 |

TABLE 6-continued

| # | Radius of throughhole R (μm) | Throughhole pitch | Diameter of bottom of second filled via (μm) | Diameter of bottom of first filled via (μm) | Position of first filled via | Results of heat cycle test | | | | | | | First/second |
|---|---|---|---|---|---|---|---|---|---|---|---|---|---|
| | | | | | | 500 | 1000 | 1250 | 1500 | 1750 | 2000 | 2500 | |
| Example 180 | 100 | 192.5 | 30 | 60 | (iv) | ○ | ○ | Δ | X | X | X | X | 2 |
| Example 181 | 100 | 192.5 | 30 | 65 | (i) | ○ | ○ | ○ | ○ | ○ | ○ | X | 2.167 |
| Example 182 | 100 | 192.5 | 30 | 65 | (ii) | ○ | ○ | Δ | Δ | X | X | X | 2.167 |
| Example 183 | 100 | 192.5 | 30 | 65 | (iii) | ○ | ○ | ○ | ○ | Δ | X | X | 2.167 |
| Example 184 | 100 | 192.5 | 30 | 65 | (iv) | ○ | ○ | Δ | X | X | X | X | 2.167 |
| Example 185 | 100 | 192.5 | 45 | 50 | (i) | ○ | ○ | ○ | ○ | ○ | ○ | X | 1.111 |
| Example 186 | 100 | 192.5 | 45 | 50 | (ii) | ○ | ○ | Δ | Δ | X | X | X | 1.111 |

TABLE 7

| # | Radius of throughhole R (μm) | Throughhole pitch | Diameter of bottom of second filled via (μm) | Diameter of bottom of first filled via (μm) | Position of first filled via | Results of heat cycle test | | | | | | | First/second |
|---|---|---|---|---|---|---|---|---|---|---|---|---|---|
| | | | | | | 500 | 1000 | 1250 | 1500 | 1750 | 2000 | 2500 | |
| Example 187 | 100 | 192.5 | 45 | 50 | (iii) | ○ | ○ | ○ | ○ | Δ | X | X | 1.111 |
| Example 188 | 100 | 192.5 | 45 | 50 | (iv) | ○ | ○ | Δ | X | X | X | X | 1.111 |
| Example 189 | 100 | 192.5 | 45 | 60 | (i) | ○ | ○ | ○ | ○ | ○ | ○ | ○ | 1.333 |
| Example 190 | 100 | 192.5 | 45 | 60 | (ii) | ○ | ○ | Δ | Δ | X | X | X | 1.333 |
| Example 191 | 100 | 192.5 | 45 | 60 | (iii) | ○ | ○ | ○ | ○ | Δ | X | X | 1.333 |
| Example 192 | 100 | 192.5 | 45 | 60 | (iv) | ○ | ○ | Δ | X | X | X | X | 1.333 |
| Example 193 | 100 | 192.5 | 45 | 65 | (i) | ○ | ○ | ○ | ○ | ○ | ○ | ○ | 1.444 |
| Example 194 | 100 | 192.5 | 45 | 65 | (ii) | ○ | ○ | Δ | Δ | X | X | X | 1.444 |
| Example 195 | 100 | 192.5 | 45 | 65 | (iii) | ○ | ○ | ○ | ○ | Δ | X | X | 1.444 |
| Example 196 | 100 | 192.5 | 45 | 65 | (iv) | ○ | ○ | Δ | X | X | X | X | 1.444 |
| Example 197 | 100 | 192.5 | 65 | 70 | (i) | ○ | ○ | ○ | ○ | ○ | ○ | X | 1.077 |
| Example 198 | 100 | 192.5 | 65 | 70 | (ii) | ○ | ○ | Δ | Δ | X | X | X | 1.077 |
| Example 199 | 100 | 192.5 | 65 | 70 | (iii) | ○ | ○ | ○ | ○ | Δ | X | X | 1.077 |
| Example 200 | 100 | 192.5 | 65 | 70 | (iv) | ○ | ○ | Δ | X | X | X | X | 1.077 |
| Example 201 | 125 | 225 | 30 | 35 | (i) | ○ | ○ | ○ | ○ | ○ | ○ | X | 1.167 |
| Example 202 | 125 | 225 | 30 | 35 | (ii) | ○ | ○ | Δ | Δ | X | X | X | 1.167 |
| Example 203 | 125 | 225 | 30 | 35 | (iii) | ○ | ○ | ○ | ○ | Δ | X | X | 1.167 |
| Example 204 | 125 | 225 | 30 | 35 | (iv) | ○ | ○ | Δ | X | X | X | X | 1.167 |
| Example 205 | 125 | 225 | 30 | 40 | (i) | ○ | ○ | ○ | ○ | ○ | ○ | ○ | 1.333 |
| Example 206 | 125 | 225 | 30 | 40 | (ii) | ○ | ○ | Δ | Δ | X | X | X | 1.333 |
| Example 207 | 125 | 225 | 30 | 40 | (iii) | ○ | ○ | ○ | ○ | Δ | X | X | 1.333 |
| Example 208 | 125 | 225 | 30 | 40 | (iv) | ○ | ○ | Δ | X | X | X | X | 1.333 |
| Example 209 | 125 | 225 | 30 | 45 | (i) | ○ | ○ | ○ | ○ | ○ | ○ | ○ | 1.5 |
| Example 210 | 125 | 225 | 30 | 45 | (ii) | ○ | ○ | Δ | Δ | X | X | X | 1.5 |
| Example 211 | 125 | 225 | 30 | 45 | (iii) | ○ | ○ | ○ | ○ | Δ | X | X | 1.5 |
| Example 212 | 125 | 225 | 30 | 45 | (iv) | ○ | ○ | Δ | X | X | X | X | 1.5 |
| Example 213 | 125 | 225 | 30 | 50 | (i) | ○ | ○ | ○ | ○ | ○ | ○ | ○ | 1.667 |
| Example 214 | 125 | 225 | 30 | 50 | (ii) | ○ | ○ | Δ | Δ | X | X | X | 1.667 |
| Example 215 | 125 | 225 | 30 | 50 | (iii) | ○ | ○ | ○ | ○ | Δ | X | X | 1.667 |
| Example 216 | 125 | 225 | 30 | 50 | (iv) | ○ | ○ | Δ | X | X | X | X | 1.667 |
| Example 217 | 125 | 225 | 30 | 60 | (i) | ○ | ○ | ○ | ○ | ○ | ○ | X | 2 |
| Example 218 | 125 | 225 | 30 | 60 | (ii) | ○ | ○ | Δ | Δ | X | X | X | 2 |
| Example 219 | 125 | 225 | 30 | 60 | (iii) | ○ | ○ | ○ | ○ | Δ | X | X | 2 |

TABLE 8

| # | Radius of throughhole R (μm) | Throughhole pitch | Diameter of bottom of second filled via (μm) | Diameter of bottom of first filled via (μm) | Position of first filled via | Results of heat cycle test | | | | | | | First/second |
|---|---|---|---|---|---|---|---|---|---|---|---|---|---|
| | | | | | | 500 | 1000 | 1250 | 1500 | 1750 | 2000 | 2500 | |
| Example 220 | 125 | 225 | 30 | 60 | (iv) | ○ | ○ | Δ | X | X | X | X | 2 |
| Example 221 | 125 | 225 | 30 | 65 | (i) | ○ | ○ | ○ | ○ | ○ | ○ | X | 2.167 |
| Example 222 | 125 | 225 | 30 | 65 | (ii) | ○ | ○ | Δ | Δ | X | X | X | 2.167 |
| Example 223 | 125 | 225 | 30 | 65 | (iii) | ○ | ○ | ○ | ○ | Δ | X | X | 2.167 |

TABLE 8-continued

| # | Radius of throughhole R (μm) | Throughhole pitch | Diameter of bottom of second filled via (μm) | Diameter of bottom of first filled via (μm) | Position of first filled via | Results of heat cycle test 500 | 1000 | 1250 | 1500 | 1750 | 2000 | 2500 | First/ second |
|---|---|---|---|---|---|---|---|---|---|---|---|---|---|
| Example 224 | 125 | 225 | 30 | 65 | (iv) | ○ | ○ | Δ | X | X | X | X | 2.167 |
| Example 225 | 125 | 225 | 45 | 50 | (i) | ○ | ○ | ○ | ○ | ○ | ○ | X | 1.111 |
| Example 226 | 125 | 225 | 45 | 50 | (ii) | ○ | ○ | Δ | Δ | X | X | X | 1.111 |
| Example 227 | 125 | 225 | 45 | 50 | (iii) | ○ | ○ | ○ | ○ | Δ | X | X | 1.111 |
| Example 228 | 125 | 225 | 45 | 50 | (iv) | ○ | ○ | Δ | X | X | X | X | 1.111 |
| Example 229 | 125 | 225 | 45 | 60 | (i) | ○ | ○ | ○ | ○ | ○ | ○ | ○ | 1.333 |
| Example 230 | 125 | 225 | 45 | 60 | (ii) | ○ | ○ | Δ | Δ | X | X | X | 1.333 |
| Example 231 | 125 | 225 | 45 | 60 | (iii) | ○ | ○ | ○ | ○ | ○ | Δ | X | 1.333 |
| Example 232 | 125 | 225 | 45 | 60 | (iv) | ○ | ○ | Δ | X | X | X | X | 1.333 |
| Example 233 | 125 | 225 | 45 | 65 | (i) | ○ | ○ | ○ | ○ | ○ | ○ | ○ | 1.444 |
| Example 234 | 125 | 225 | 45 | 65 | (ii) | ○ | ○ | Δ | Δ | X | X | X | 1.444 |
| Example 235 | 125 | 225 | 45 | 65 | (iii) | ○ | ○ | ○ | ○ | Δ | X | X | 1.444 |
| Example 236 | 125 | 225 | 65 | 65 | (iv) | ○ | ○ | Δ | X | X | X | X | 1.444 |
| Example 237 | 125 | 225 | 65 | 70 | (i) | ○ | ○ | ○ | ○ | ○ | ○ | X | 1.077 |
| Example 238 | 125 | 225 | 65 | 70 | (ii) | ○ | ○ | Δ | Δ | X | X | X | 1.077 |
| Example 239 | 125 | 225 | 65 | 70 | (iii) | ○ | ○ | ○ | ○ | Δ | X | X | 1.077 |
| Example 240 | 125 | 225 | 65 | 70 | (iv) | ○ | ○ | Δ | X | X | X | X | 1.077 |

Position of the first filled via
(i) On a cover plated layer and inside the area under which a throughhole opening is formed.
(ii) On a land portion (36e). See FIG. 9 (G).
(iii) On a cover plated layer and outside the area under which a throughhole opening is formed.
(iv) On a cover plated layer and above an edge portion of a throughhole opening.

TABLE 9

| # | Radius of throughhole R (μm) | Throughhole pitch | Diameter of bottom of second filled via (μm) | Diameter of bottom of first filled via (μm) | Position of first filled via | Results of heat cycle test 500 | 1000 | 1250 | 1500 | 1750 | 2000 | 2500 | First/ second |
|---|---|---|---|---|---|---|---|---|---|---|---|---|---|
| No. 2 Example 1 | 50 | 150 | 30 | 35 | (i) for right under IC; (iii) for all the other regions | ○ | ○ | ○ | ○ | ○ | ○ | X | 1.167 |
| No. 2 Example 2 | 50 | 150 | 30 | 40 | (i) for right under IC; (iii) for all the other regions | ○ | ○ | ○ | ○ | ○ | ○ | ○ | 1.333 |
| No. 2 Example 3 | 50 | 150 | 30 | 45 | (i) for right under IC; (iii) for all the other regions | ○ | ○ | ○ | ○ | ○ | ○ | ○ | 1.5 |
| No. 2 Example 4 | 50 | 150 | 30 | 50 | (i) for right under IC; (iii) for all the other regions | ○ | ○ | ○ | ○ | ○ | ○ | ○ | 1.667 |
| No. 2 Example 5 | 50 | 150 | 30 | 60 | (i) for right under IC; (iii) for all the other regions | ○ | ○ | ○ | ○ | ○ | ○ | X | 2 |
| No. 2 Example 6 | 50 | 150 | 30 | 65 | (i) for right under IC; (iii) for all the other regions | ○ | ○ | ○ | ○ | ○ | ○ | X | 2.167 |
| No. 2 Example 7 | 50 | 150 | 45 | 50 | (i) for right under IC; (iii) for all the other regions | ○ | ○ | ○ | ○ | ○ | ○ | X | 1.111 |
| No. 2 Example 8 | 50 | 150 | 45 | 60 | (i) for right under IC; (iii) for all the other regions | ○ | ○ | ○ | ○ | ○ | ○ | ○ | 1.333 |
| No. 2 Example 9 | 50 | 150 | 45 | 65 | (i) for right under IC; (iii) for all the other regions | ○ | ○ | ○ | ○ | ○ | ○ | ○ | 1.444 |

TABLE 9-continued

| # | Radius of through-hole R (μm) | Through-hole pitch | Diameter of bottom of second filled via (μm) | Diameter of bottom of first filled via (μm) | Position of first filled via | Results of heat cycle test | | | | | | | First/second |
|---|---|---|---|---|---|---|---|---|---|---|---|---|---|
| | | | | | | 500 | 1000 | 1250 | 1500 | 1750 | 2000 | 2500 | |
| No. 2 Example 10 | 50 | 150 | 65 | 70 | (i) for right under IC; (iii) for all the other regions | ○ | ○ | ○ | ○ | ○ | ○ | X | 1.077 |
| No. 2 Example 11 | 100 | 192.5 | 30 | 35 | (i) for right under IC; (iii) for all the other regions | ○ | ○ | ○ | ○ | ○ | ○ | X | 1.167 |
| No. 2 Example 12 | 100 | 192.5 | 30 | 40 | (i) for right under IC; (iii) for all the other regions | ○ | ○ | ○ | ○ | ○ | ○ | ○ | 1.333 |
| No. 2 Example 13 | 100 | 192.5 | 30 | 45 | (i) for right under IC; (iii) for all the other regions | ○ | ○ | ○ | ○ | ○ | ○ | ○ | 1.5 |
| No. 2 Example 14 | 100 | 192.5 | 30 | 50 | (i) for right under IC; (iii) for all the other regions | ○ | ○ | ○ | ○ | ○ | ○ | ○ | 1.667 |
| No. 2 Example 15 | 100 | 192.5 | 30 | 60 | (i) for right under IC; (iii) for all the other regions | ○ | ○ | ○ | ○ | ○ | ○ | X | 2 |
| No. 2 Example 16 | 100 | 192.5 | 30 | 65 | (i) for right under IC; (iii) for all the other regions | ○ | ○ | ○ | ○ | ○ | ○ | X | 2.167 |
| No. 2 Example 17 | 100 | 192.5 | 45 | 50 | (i) for right under IC; (iii) for all the other regions | ○ | ○ | ○ | ○ | ○ | ○ | X | 1.111 |
| No. 2 Example 18 | 100 | 192.5 | 45 | 60 | (i) for right under IC; (iii) for all the other regions | ○ | ○ | ○ | ○ | ○ | ○ | ○ | 1.333 |
| No. 2 Example 19 | 100 | 192.5 | 45 | 65 | (i) for right under IC; (iii) for all the other regions | ○ | ○ | ○ | ○ | ○ | ○ | ○ | 1.444 |
| No. 2 Example 20 | 100 | 192.5 | 65 | 70 | (i) for right under IC; (iii) for all the other regions | ○ | ○ | ○ | ○ | ○ | ○ | X | 1.077 |
| No. 2 Example 21 | 125 | 225 | 30 | 35 | (i) for right under IC; (iii) for all the other regions | ○ | ○ | ○ | ○ | ○ | ○ | X | 1.167 |
| No. 2 Example 22 | 125 | 225 | 30 | 40 | (i) for right under IC; (iii) for all the other regions | ○ | ○ | ○ | ○ | ○ | ○ | ○ | 1.333 |
| No. 2 Example 23 | 125 | 225 | 30 | 45 | (i) for right under IC; (iii) for all the other regions | ○ | ○ | ○ | ○ | ○ | ○ | ○ | 1.5 |
| No. 2 Example 24 | 125 | 225 | 30 | 50 | (i) for right under IC; (iii) for all the other regions | ○ | ○ | ○ | ○ | ○ | ○ | ○ | 1.667 |
| No. 2 Example 25 | 125 | 225 | 30 | 60 | (i) for right under IC; (iii) for all the other regions | ○ | ○ | ○ | ○ | ○ | ○ | X | 2 |
| No. 2 Example 26 | 125 | 225 | 30 | 65 | (i) for right under IC; (iii) for all the other regions | ○ | ○ | ○ | ○ | ○ | ○ | X | 2.167 |
| No. 2 Example 27 | 125 | 225 | 45 | 50 | (i) for right under IC; (iii) for all the other regions | ○ | ○ | ○ | ○ | ○ | ○ | X | 1.111 |

TABLE 9-continued

| # | Radius of through-hole R (μm) | Through-hole pitch | Diameter of bottom of second filled via (μm) | Diameter of bottom of first filled via (μm) | Position of first filled via | Results of heat cycle test | | | | | | | First/second |
|---|---|---|---|---|---|---|---|---|---|---|---|---|---|
| | | | | | | 500 | 1000 | 1250 | 1500 | 1750 | 2000 | 2500 | |
| No. 2 Example 28 | 125 | 225 | 45 | 60 | (i) for right under IC; (iii) for all the other regions | ○ | ○ | ○ | ○ | ○ | ○ | ○ | 1.333 |
| No. 2 Example 29 | 125 | 225 | 45 | 65 | (i) for right under IC; (iii) for all the other regions | ○ | ○ | ○ | ○ | ○ | ○ | ○ | 1.444 |
| No. 2 Example 30 | 125 | 225 | 32.5 | 70 | (i) for right under IC; (iii) for all the other regions | ○ | ○ | ○ | ○ | ○ | ○ | X | 2.154 |

Position of the first filled via
(i) On a cover plated layer and inside the area under which a throughhole opening is formed.
(iii) On a cover plated layer and outside the area under which a throughhole opening is formed.

According to the assessment results, it was found that Examples 1~120 whose bottom diameter of the first filled via was larger than that of the second filled via met the target specification and was acceptable even at the 1250th cycle. On the other hand, comparative examples whose bottom diameter of the first filled via was equal to or less than that of the second filled via was "normal" or "poor" at the target specification cycle, and all of them were "poor" at the 1250th cycle. In Comparative Examples 1~6, the bonding between the second filled via and the surface of the first filled via might have become stronger, because the bottom diameter of the second filled via was equal to or larger than the bottom diameter of the first filled via. As a result, it might have become difficult for the second filled via and resin insulation layers around it to deform so as to ease the stress. Therefore, it is speculated that the stress during heating and cooling cycles was concentrated on the land (cover-like conductor layer if the land shape was one of Types (i), (iii), and (iv)) of the first filled via and the bottom of the first filled via, which weakened the bonding between the bottom of the first filled via and the land and resulted in a rise of connection resistance.

The comparison between Comparative Examples 1~4 and Comparative Examples 5 and 6 shows that the target specification was satisfied when the diameter of a throughhole and its pitch were lower in density, even if the bottom diameter of the first filled via was equal to or less than that of the second filled via. However, the results were poor at the 1000th cycle if the radius of a throughhole was 100 μm or less and its pitch was 385 μm or less. It is speculated that this was because the latter had stronger stress. One speculated reason is that deformation of the multi-layer printed wiring board was larger in Comparative Examples 5 and 6, because a throughhole conductor (copper: 16 ppm) that had a thermal expansion coefficient different from that of the insulative core substrate (thermal expansion coefficient: 50~60 ppm) was furnished on the core substrate in high density. Therefore, it is advantageous to apply the present embodiment to multi-layer printed wiring boards whose throughhole is 100 μm or less in radius and pitch is 385 μm or less.

According to the results of Examples 1~120 at the 1500th, 1750th, and 2000th cycles, it was found that the heat-cycle resistance varied depending on the land shape of the first filled via, even if the bottom diameter of the first filled via was larger than the bottom diameter of the second filled via. Long-term reliability was superior in the order of (i), (iii), (ii), and (iv). The throughhole structures formed on the insulative core substrate were different from the core substrate in terms of physical properties such as Young's modulus, Poisson ratio, and thermal expansion coefficient. It is therefore speculated that this was because stress applied to the section between the bottom of first filled via and the land changed depending on various conditions including the land shape of the first filled via, the position of the first filled via, and wiring or no wiring between the land and the throughhole. Since they are different in physical properties, the insulative substrate and throughholes were deformed differently. It is speculated that stress applied to the bottom of the first filled via was larger in (iv) than in (i)~(iii) because the bottom of the first filled via was placed on both sides. On the other hand, it is considered that (i)~(iii) were superior in heat-cycle resistance because the first filled via was on the throughhole or the insulative substrate. The reason why (iii) was inferior to (i) was considered that inside of a throughhole was small in deformation compared with the insulative substrate because copper, which allowed less deformation due to larger Young's modulus and smaller thermal expansion coefficient compared with the insulative substrate, was formed on the inner wall of the throughhole as a throughhole sidewall conductor. The coarse layer 36a (see FIG. 1(D)) of the inner wall might have some influence on the result. Therefore, it is considered that stress applied to the section between the bottom of the first filled via and the land (cover-like conductor layer) became small. Moreover, the land of the first filled via was positioned closer to a throughhole in (iii) than in (ii). It is therefore considered that (iii) was small in the deformation of the first filled via due to the influence of the throughhole sidewall conductor.

Based on the results at the 2500th cycle, it was found that the ratio of the bottom diameter of the first filled via with respect to the bottom diameter of the second filled via was preferably 1.3~1.7. It is considered that this was because the bonding power/stress became substantially equal in this range because of the difference of stress between both sections, even if the bonding force between the bottom of the second filled via and the surface of the first filled via was weaker than the bonding force (adhesive force per unit area× bonding area) between the land of the first filled via (cover-like conductor layer in the case of Types (i), (iii), and (iv)) and the bottom of the first filled via. (If there is any difference between them, stress is concentrated on the weak side, resulting in problems including detachment.)

The results of Examples 120~240 were similar to those of Examples 1~120. The results of "No. 2 Examples 1~30" and those of Examples 1, 5 . . . 113, 117 (the land of the first filled via was (i) in Examples 1~120) were similar. Accordingly, it is desirable that at least the first filled via right below IC is formed right above a throughhole, and that its bottom diameter is formed larger than that of the second filled via. It is speculated that this is because stress right below IC is large due to the difference of thermal expansion coefficient between IC and the insulative substrate.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A multi-layer printed wiring board comprising:
   a core substrate having a plurality of through-hole structures formed through the core substrate;
   a first interlayer insulation layer formed over the core substrate;
   a plurality of first filled vias formed in the first interlayer insulation layer and each having a bottom portion having a first diameter;
   a second interlayer insulation layer formed over the first interlayer insulation layer;
   a plurality of second filled vias formed in the second interlayer insulation layer and each having a bottom portion having a second diameter smaller than the first diameter;
   a plurality of pad structures formed on the second interlayer insulation layer and connected to the second filled vias, respectively;
   a solder resist layer formed over the second interlayer insulation layer and having a plurality of opening portions each exposing at least a portion of each of the pad structures; and
   a plurality of bump structures formed in the opening portions of the solder resist layer, respectively, and positioned to be connected to an IC chip,
   wherein each of the through-hole structures includes a sidewall conductor layer extending through the core substrate, the second filled vias are connected to the first filled vias, respectively, and positioned such that the second filled vias are under the IC chip, the first filled vias and second filled vias include ones positioned over the through-hole structure and on or inside an area over which the sidewall conductor layer of the through-hole structure is formed and ones positioned offset from the through-hole structure and outside the area, and the bump structures are connected to the second filled vias by the pad structures formed outside of the sidewall conductor layer, respectively; wherein
   the core substrate has a plurality of through-hole openings each having a radius of 100 μm or less, formed at a pitch of 385 μm or less, and the plurality.

2. The multi-layer printed wiring board according to claim 1, wherein a ratio of the first diameter with respect to the second diameter is in a range between 1.3 and 1.7.

3. The multi-layer printed wiring board according to claim 1, wherein the core substrate has a plurality of through-hole openings, each of the through-hole structures comprises a filler filling each of the through-hole opening openings and a cover plated layer covering each of the through-hole openings, and each of the first filled vias is formed over the cover plated layer.

4. The multi-layer printed wiring board according to claim 3, wherein the cover plated layer has a substantially circular portion covering each of the through-hole openings.

5. The multi-layer printed wiring board according to claim 4, wherein the plurality of first filled vias includes at least one which is positioned within the substantially circular portion of the cover plated layer.

6. The multi-layer printed wiring board according to claim 5, wherein the through-hole structure has a sidewall conductor layer formed in the through-hole opening, and the first filled via is positioned over an area under which the sidewall conductor layer of the through-hole structure is formed.

7. The multi-layer printed wiring board according to claim 3, wherein the cover plated layer has a first semicircular portion and a second semicircular portion joined together, the first semicircular portion is formed over the through-hole opening, and the first filled via is formed over the second semicircular portion.

8. The multi-layer printed wiring board according to claim 1, further comprising a plurality of cover plated layers formed over the core substrate, wherein the core substrate has a plurality of through-hole openings, each of the first filled vias has a land portion, and each of the cover plated layers covers each of the through-hole openings of the core substrate.

9. The multi-layer printed wiring board according to claim 1, further comprising a cover plated layer formed over the core substrate, wherein the core substrate has a through-hole opening, and the cover plated layer covers the through-hole opening of the core substrate and has a horizontally protruding portion over which the first filled via is formed.

10. The multi-layer printed wiring board according to claim 1, wherein each of the through-hole structures is filled with a conductive material.

11. The multi-layer printed wiring board according to claim 1, wherein the first filled vias have end surfaces facing the second interlayer insulation layer, and the end surfaces of the first filled vias have center portions which are ±7 μm in height with respect to peripheral portions of the end surfaces of the first filled vias.

12. The multi-layer printed wiring board according to claim 1, wherein the second filled vias have end surfaces facing the solder resist layer, and the end surfaces of the second filled vias have center portions which are ±7 μm in height with respect to peripheral portions of the end surfaces of the second filled vias.

* * * * *